United States Patent (12)
Kim et al.

(10) Patent No.: US 12,298,613 B2
(45) Date of Patent: May 13, 2025

(54) DISPLAY DEVICE

(71) Applicant: SAMSUNG DISPLAY CO., LTD., Yongin-si (KR)

(72) Inventors: Ran Kim, Anyang-si (KR); Juwon Lee, Anyang-si (KR); Kihyun Kim, Hwaseong-si (KR); Younggil Park, Anyang-si (KR); Sooim Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/515,203

(22) Filed: Nov. 20, 2023

(65) Prior Publication Data

US 2024/0094573 A1 Mar. 21, 2024

Related U.S. Application Data

(63) Continuation of application No. 18/046,430, filed on Oct. 13, 2022, now Pat. No. 11,822,169.

(30) Foreign Application Priority Data

Mar. 10, 2022 (KR) ........................ 10-2022-0029908

(51) Int. Cl.
*G02F 1/1333* (2006.01)
*G02F 1/13357* (2006.01)
(Continued)

(52) U.S. Cl.
CPC .. *G02F 1/133305* (2013.01); *G02F 1/133617* (2013.01); *G02F 1/1339* (2013.01); *H10K 50/8426* (2023.02)

(58) Field of Classification Search
None
See application file for complete search history.

(56) References Cited

U.S. PATENT DOCUMENTS 6,456,347 B1 * 9/2002 Motomura ........ G02F 1/133555
349/113
10,216,032 B1 2/2019 Liu et al.
(Continued)

FOREIGN PATENT DOCUMENTS

KR 10-0463595 B1 12/2004
KR 10-0522252 B1 10/2005
(Continued)

*Primary Examiner* — Richard H Kim
(74) *Attorney, Agent, or Firm* — Womble Bond Dickinson (US) LLP

(57) ABSTRACT

A display device includes: a first substrate including a first area, a second area surrounding the first area, and a third area surrounding the second area; a second substrate facing the first substrate; a sealing member between the first substrate and the second substrate at the third area; a color filter layer under the second substrate; a low refractive index layer under the color filter layer, overlapping with the first area, and spaced from the sealing member; a protective layer covering the low refractive index layer, surrounding a side surface of the low refractive index layer, and including an inorganic material; and a color conversion layer under the protective layer, overlapping with the first area, and including a plurality of color conversion parts spaced from each other.

16 Claims, 24 Drawing Sheets

(51) Int. Cl.
G02F 1/1339 (2006.01)
H10K 50/842 (2023.01)

(56) References Cited

U.S. PATENT DOCUMENTS

| | | | |
|---|---|---|---|
| 11,800,772 B2 * | 10/2023 | Oh | H10K 59/38 |
| 2008/0062374 A1 * | 3/2008 | Katsumura | G02F 1/1339 |
| | | | 349/190 |
| 2020/0081292 A1 | 3/2020 | Park et al. | |

FOREIGN PATENT DOCUMENTS

| | | |
|---|---|---|
| KR | 10-1872963 B1 | 6/2018 |
| KR | 10-2020-0003330 A | 1/2020 |
| KR | 10-2254058 B1 | 5/2021 |

* cited by examiner

DISPLAY DEVICE

CROSS-REFERENCE TO RELATED APPLICATIONS

This application is a continuation of U.S. patent application Ser. No. 18/046,430, filed Oct. 13, 2022, which claims priority to and the benefit of Korean Patent Application No. 10-2022-0029908, filed Mar. 10, 2022, the entire content of both of which is incorporated herein by reference.

BACKGROUND

1. Field

Aspects of embodiments of the present disclosure relate to a display device, and more particularly, to a flat panel display device.

2. Description of the Related Art

A display device is a device that displays an image for providing visual information to a user. Representative examples of such a display device include a liquid crystal display device and an organic light emitting display device.

Recently, in order to improve display quality, a display device including a display substrate including a plurality of pixels, and a color conversion substrate including a color filter layer and a color conversion layer has been proposed. The color conversion layer may convert a wavelength of light provided from the display substrate. Accordingly, the display device including the color conversion layer may emit light having a color different from that of incident light. For example, the color conversion layer may include wavelength conversion particles, such as quantum dots.

The above information disclosed in this Background section is for enhancement of understanding of the background of the present disclosure, and therefore, it may contain information that does not constitute prior art.

SUMMARY

One or more embodiments of the present disclosure are directed to a display device having improved reliability.

According to one or more embodiments of the present disclosure, a display device includes: a first substrate including a first area, a second area surrounding the first area, and a third area surrounding the second area; a second substrate facing the first substrate; a sealing member between the first substrate and the second substrate at the third area; a color filter layer under the second substrate; a low refractive index layer under the color filter layer, overlapping with the first area, and spaced from the sealing member; a protective layer covering the low refractive index layer, surrounding a side surface of the low refractive index layer, and including an inorganic material; and a color conversion layer under the protective layer, overlapping with the first area, and including a plurality of color conversion parts spaced from each other.

In an embodiment, the protective layer may overlap with the first area, the second area, and the third area.

In an embodiment, the protective layer may contact the side surface of the low refractive index layer.

In an embodiment, the color filter layer may overlap with the sealing member.

In an embodiment, the protective layer may surround a side surface of the color filter layer.

In an embodiment, the color filter layer may be spaced from the sealing member in a plan view.

In an embodiment, the protective layer may surround a side surface of the color filter layer, and the side surface of the low refractive index layer.

In an embodiment, the display device may further include: a barrier layer under the protective layer.

In an embodiment, the barrier layer may overlap with the second area.

In an embodiment, at least a portion of the barrier layer may overlap with the color conversion layer, and the portion of the barrier layer may be under the color conversion layer.

In an embodiment, the barrier layer may overlap with the sealing member.

In an embodiment, the barrier layer may be spaced from the sealing member in a plan view.

In an embodiment, the barrier layer may include at least one organic film, or at least one inorganic film.

In an embodiment, the low refractive index layer may have a metal ion concentration of less than about 1 at %.

According to one or more embodiments of the present disclosure, a display device includes: a first substrate including a first area, a second area surrounding the first area, and a third area surrounding the second area; a second substrate facing the first substrate; a sealing member between the first substrate and the second substrate at the third area; a color filter layer under the second substrate, and spaced from the sealing member in a plan view; a low refractive index layer under the color filter layer, and overlapping with the first area; a protective layer covering the low refractive index layer, surrounding a side surface of the low refractive index layer, and including an inorganic material; and a color conversion layer under the protective layer, overlapping with the first area, and including a plurality of color conversion parts spaced from each other.

In an embodiment, the low refractive index layer may contact a side surface of the color filter layer.

In an embodiment, the low refractive index layer may overlap with the sealing member.

In an embodiment, the display device may further include: a barrier layer under the protective layer, and overlapping with the second area.

In an embodiment, at least a portion of the barrier layer may overlap with the color conversion layer, and the portion of the barrier layer may be under the color conversion layer.

In an embodiment, the barrier layer may include at least one organic film, or at least one inorganic film.

According to one or more embodiments of the present disclosure, as the low refractive index layer included in the display device may be spaced apart from the sealing member in a plan view, and the protective layer may cover the low refractive index layer to prevent or substantially prevent the low refractive index layer from being exposed to the outside, the display device may prevent or substantially prevent outside moisture from entering through the low refractive index layer. Accordingly, the reliability of the display device may be improved by preventing or substantially preventing the display device from being defective.

According to one or more embodiments of the present disclosure, because the display device may further include the barrier layer, the barrier layer may prevent or substantially prevent moisture introduced through the upper substrate from moving toward the lower substrate. Accordingly, the reliability of the display device may be improved by preventing or substantially preventing the display device from being defective.

According to one or more embodiments of the present disclosure, as the color filter layer may not overlap with the sealing member, the color filter layer and the low refractive index layer may be prevented or substantially prevented from being exposed to the outside. Accordingly, moisture may be more effectively prevented or substantially prevented from entering through the color filter layer and the low refractive index layer.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
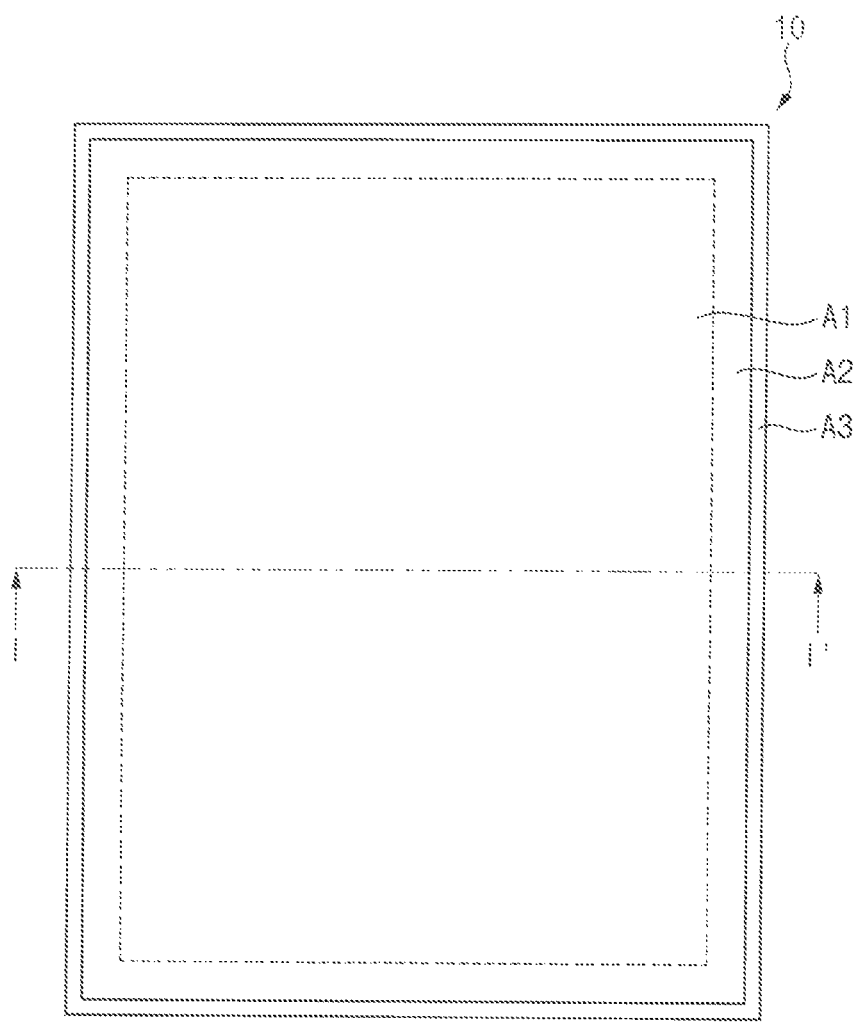
FIG. 1 is a plan view illustrating a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
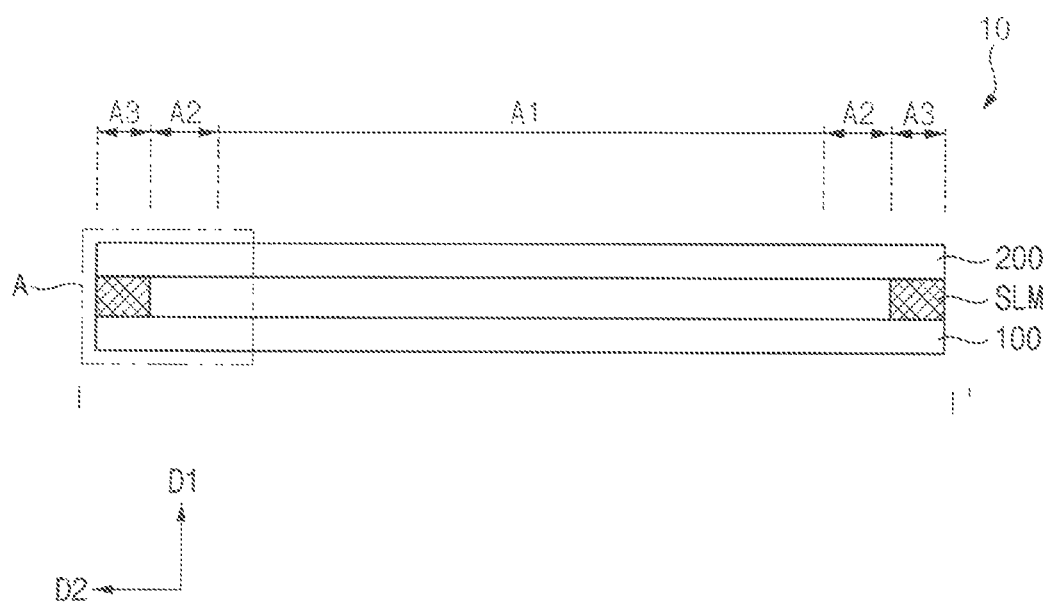
FIG. 2 is a cross-sectional view taken along the line I-I' of FIG. 1.

FIG. 1 is a plan view illustrating a display device according to an embodiment. FIG. 2 is a cross-sectional view taken along the line I-I' of FIG. 1.

Referring to FIGS. 1 and 2, a display device 10 may include a lower substrate 100, an upper substrate 200, and a sealing member SLM. The upper substrate 200 may face the lower substrate 100. The upper substrate 200 may be positioned in a first direction D1 from the lower substrate 100. For example, the first direction D1 may be a front direction of the display device 10 from the lower substrate 100. The sealing member SLM may be disposed between the lower substrate 100 and the upper substrate 200. The sealing member SLM may combine (e.g., connect or attach) the lower substrate 100 and the upper substrate 200 to each other.

The display device 10 may include a first area A1 at (e.g., in or on) which an image is displayed, a second area A2 disposed outside the first area A1, and a third area A3 disposed outside the second area A2. For example, the first area A1 may be a display area, the second area A2 may be a non-display area, and the third area A3 may be a sealing area. The second area A2 may surround (e.g., around a periphery of) the first area A1 in a plan view, and the third area A3 may surround (e.g., around a periphery of) the second area A2 in the plan view.

The lower substrate 100 may include a plurality of pixels, and may be referred to as a display substrate. The pixels may be disposed at (e.g., in or on) the first area A1 of the lower substrate 100. Each of the pixels may include a driving element and a light emitting element. The driving element may include at least one thin film transistor. The light emitting element may generate light according to a driving signal. For example, the light emitting element may be an inorganic light emitting diode or an organic light emitting diode.

The upper substrate 200 may include a color conversion layer, and may be referred to as a color conversion substrate. The color conversion layer may be disposed at (e.g., in or on) the first area A1, and may convert a wavelength of light generated from the light emitting element of the lower substrate 100. The upper substrate 200 may further include a color filter layer, which transmits light of a suitable color (e.g., a specific or predetermined color).

The sealing member SLM may combine (e.g., connect or attach) the lower substrate 100 and the upper substrate 200 to each other. The sealing member SLM may be disposed between the lower substrate 100 and the upper substrate 200, and may be disposed at (e.g., in or on) the third area A3. For example, the sealing member SLM may be disposed at (e.g., in or on) the third area A3 between the lower substrate 100 and the upper substrate 200 to surround (e.g., around a periphery of) the second area A2 in the plan view. For example, the sealing member SLM may have a planar shape of a hollow rectangle shape. However, the present disclosure is not limited thereto, and the sealing member SLM may have various suitable planar shapes depending on a planar shape of the lower substrate 100 or the upper substrate 200. For example, when the lower substrate 100 or the upper substrate 200 has a planar shape such as a triangle, a rhombus, a polygon, a circle, or an oval, the sealing member SLM may have a planar shape such as a hollow triangle, a hollow rhombus, a hollow polygon, a hollow circle, or a hollow oval.

In an embodiment, a filling layer may be disposed between the lower substrate 100 and the upper substrate 200. For example, the filling layer may act as a buffer against external pressure applied to the display device 10. For example, the filling layer may maintain or substantially maintain a gap between the lower substrate 100 and the upper substrate 200.

Figure 3:
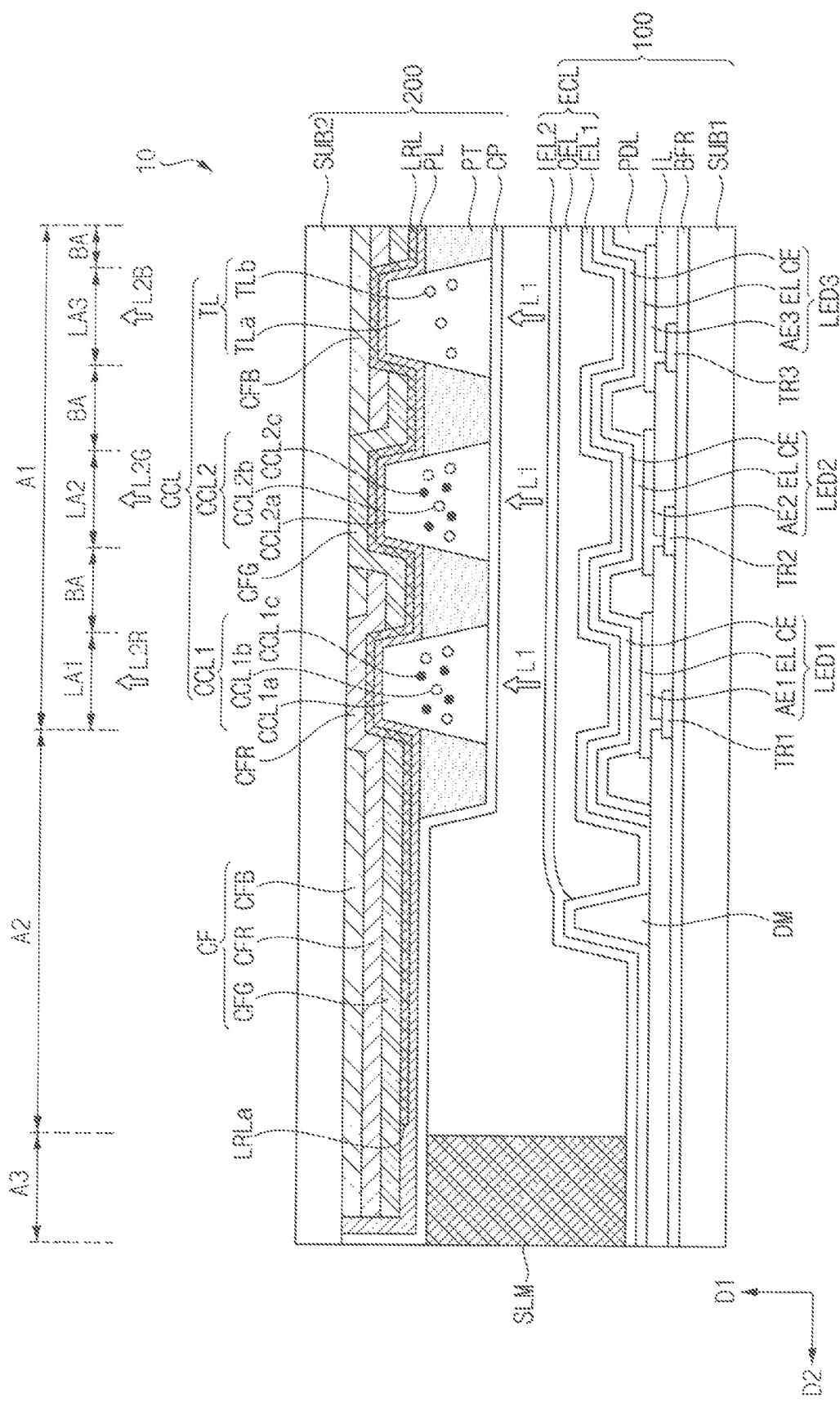
FIG. 3 is an enlarged cross-sectional view of the area A of FIG. 2.

FIG. 3 is an enlarged cross-sectional view of the area A of FIG. 2.

Referring to FIGS. 1 to 3, the first area A1 may include a light emitting area and a light blocking area BA. Light (hereinafter, referred to as incident light) L1 generated from the lower substrate 100 and incident to the upper substrate 200 may be emitted to the outside through the light emitting area. The light emitting area may include first to third light emitting areas LA1, LA2, and LA3 for emitting light of different colors from one another. For example, a first transmitted light L2R having a red color may be emitted from the first light emitting area LA1, a second transmitted light L2G having a green color may be emitted from the second light emitting area LA2, and a third transmitted light L2B having a blue color may be emitted from the third light emitting area LA3.

In an embodiment, the first to third light emitting areas LA1, LA2, and LA3 may be spaced apart from each other in the plan view, and repeatedly arranged. The light blocking area BA may surround (e.g., around a periphery of) the first to third light emitting areas LA1, LA2, and LA3 in the plan view. For example, the light blocking area BA may have a grid shape in the plan view.

In an embodiment, the lower substrate 100 may include a first substrate SUB1, a buffer layer BFR, first to third driving elements TR1, TR2, TR3, an insulation layer IL, a pixel defining layer PDL, first to third light emitting elements LED1, LED2, and LED3, and an encapsulation layer ECL.

The first substrate SUB1 may include the first area A1, the second area A2, and the third area A3, as the display device 10 includes the first area A1, the second area A2, and the third area A3.

The first substrate SUB1 may be an insulating substrate formed of a transparent material or an opaque material. In an embodiment, the first substrate SUB1 may include glass. In this case, the lower substrate 100 may be a rigid display substrate. In another embodiment, the first substrate SUB1 may include plastic. In this case, the lower substrate 100 may be a flexible display substrate.

The buffer layer BFR may be disposed on the first substrate SUB1. The buffer layer BFR may prevent or substantially prevent impurities, such as oxygen and/or moisture, from diffusing onto the first substrate SUB1 through the first substrate SUB1. The buffer layer BFR may include an inorganic material, such as a silicon compound or a metal oxide. Examples of the inorganic material include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), and/or the like. These inorganic materials may be used alone or in a suitable combination with each other. The buffer layer BFR may have a single-layer structure, or a multi-layered structure including a plurality of insulation layers.

The first to third driving elements TR1, TR2, and TR3 may be disposed at (e.g., in or on) the first area A1 on the buffer layer BFR. Each of the first to third driving elements TR1, TR2, and TR3 may include at least one thin film transistor. A channel layer of the thin film transistor may include an oxide semiconductor, a silicon semiconductor, an organic semiconductor, or the like. For example, the oxide semiconductor may include at least one oxide from among indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include amorphous silicon, polycrystalline silicon, or the like.

The insulation layer IL may cover the first to third driving elements TR1, TR2, and TR3. The insulation layer IL may include a combination of an inorganic insulation layer and an organic insulation layer.

The first to third light emitting elements LED1, LED2, and LED3 may be disposed on the insulation layer IL. For example, first to third pixel electrodes AE1, AE2, and AE3 may be disposed on the insulation layer IL. Each of the first to third pixel electrodes AE1, AE2, and AE3 may include a conductive material, such as a metal, an alloy, a conductive metal nitride, a conductive metal oxide, or a transparent conductive material. Each of the first to third pixel electrodes AE1, AE2, and AE3 may have a single-layer structure, or a multi-layered structure including a plurality of conductive layers.

The first to third pixel electrodes AE1, AE2, and AE3 may be electrically connected to the first to third driving elements TR1, TR2, and TR3, respectively, through contact holes formed in (e.g., penetrating) the insulation layer IL.

The pixel defining layer PDL may be disposed on the first to third pixel electrodes AE1, AE2, and AE3. The pixel defining layer PDL may include an organic material. Examples of the organic material include a photoresist, a polyacryl-based resin, a polyimide-based resin, a polyamide-based resin, a siloxane-based resin, an acryl-based resin, an epoxy-based resin, and/or the like. These organic materials may be used alone or in a suitable combination with each other. The pixel defining layer PDL may define a pixel opening exposing at least a portion of each of the first to third pixel electrodes AE1, AE2, and AE3.

The light emitting layer EL may be disposed on the first to third pixel electrodes AE1, AE2, and AE3 that are exposed by the pixel opening of the pixel defining layer PDL. In an embodiment, the light emitting layer EL may extend continuously or substantially continuously at (e.g., in or on) the first area A1 across a plurality of the pixels. In another embodiment, the light emitting layer EL may be spaced apart (e.g., may be separated) from the light emitting layer of an adjacent pixel.

The light emitting layer EL may include at least one of an organic light emitting material or quantum dots. In an embodiment, the light emitting layer EL may generate blue light. However, the present disclosure is not limited thereto. In another embodiment, the light emitting layer EL may generate red light or green light, or may generate light having different colors according to the pixels.

For example, the light emitting layer EL may include an organic material for emitting blue light. In this case, the light emitting layer EL may be formed in multiple layers, and may have a structure in which a plurality of blue organic light emitting layers are stacked on one another. For example, the light emitting layer EL may have a structure in which three blue organic light emitting layers are stacked on one another.

However, the present disclosure is not limited thereto, and the light emitting layer EL may have a structure in which a plurality of blue organic light emitting layers and an organic light emitting layer for emitting light of different colors are stacked on one another. For example, the light emitting layer EL may have a structure in which three blue organic light emitting layers and one green organic light emitting layer are stacked on one another. In an embodiment, various suitable functional layers, such as a hole injection layer, a hole transport layer, an electron transport layer, and/or an electron injection layer, may be disposed above and/or below the light emitting layer EL.

A common electrode CE may be disposed on the light emitting layer EL. The common electrode CE may include a conductive material, such as a metal, an alloy, a conductive metal nitride, a conductive metal oxide, or a transparent conductive material. The common electrode CE may have a single-layer structure, or a multi-layered structure including a plurality of conductive layers. In an embodiment, the common electrode CE may extend continuously or substantially continuously at (e.g., in or on) the first area A1 across a plurality of the pixels.

The first pixel electrode AE1, the light emitting layer EL, and the common electrode CE may form the first light emitting element LED1. The second pixel electrode AE2, the light emitting layer EL, and the common electrode CE may form the second light emitting element LED2. The third pixel electrode AE3, the light emitting layer EL, and the common electrode CE may form the third light emitting element LED3.

The encapsulation layer ECL may be disposed on the common electrode CE. The encapsulation layer ECL may include at least one inorganic encapsulation layer, and at least one organic encapsulation layer. In an embodiment, the encapsulation layer ECL may include a first inorganic encapsulation layer IEL1 disposed on the common electrode CE, an organic encapsulation layer OEL disposed on the first inorganic encapsulation layer IEL1, and a second inorganic encapsulation layer IEL2 disposed on the organic encapsulation layer OEL.

In an embodiment, a dam DM may be disposed at (e.g., in or on) the second area A2 on the first substrate SUB1. For example, the dam DM may surround (e.g., around a periphery of) the first area A1 in the plan view. The dam DM may prevent or substantially prevent an organic material from overflowing to the outside of the dam DM (e.g., in the second direction D2 shown in FIG. 3) during the formation of the organic encapsulation layer OEL.

The dam DM may be formed in one or a plurality of pieces. The dam DM may be formed as a single layer in which one organic layer is stacked. However, the present disclosure is not limited thereto, and the dam DM may be formed as multi-layers in which a plurality of organic layers are stacked on one another.

The upper substrate 200 may be disposed in the first direction D1 from the encapsulation layer ECL. Hereinafter, the first direction D1 may be referred to as a front direction or a thickness direction.

In an embodiment, the upper substrate 200 may include a second substrate SUB2, a color filter layer CF, a partition structure PT, a color conversion layer CCL, a low refractive index layer LRL, a protective layer PL, and a capping layer CP.

The second substrate SUB2 may include the first area A1, the second area A2, and the third area A3, as the first substrate SUB1 includes the first area A1, the second area A2, and the third area A3 described above.

The second substrate SUB2 may be an insulating substrate formed of a transparent material. The second substrate SUB2 may include glass or plastic.

Another organic layer (not shown) may be further disposed at (e.g., in or on) the first area A1 under (e.g., underneath) the second substrate SUB2. In an embodiment, the organic layer may overlap with the light blocking area BA, and may not overlap with the first to third light emitting areas LA1, LA2, and LA3. In other words, the organic layer may define the light blocking area BA and the first to third light emitting areas LA1, LA2, and LA3 at (e.g., in or on) the first area A1. The organic layer may be formed of a transparent material or an opaque organic material. In another embodiment, the organic layer may also overlap with the first to third light emitting areas LA1, LA2, and LA3.

The color filter layer CF may be disposed under (e.g., underneath) the second substrate SUB2. For example, the color filter layer CF may be disposed under (e.g., underneath) the second substrate SUB2, and may overlap with the first area A1. The color filter layer CF may include a red color filter CFR, a green color filter CFG, and a blue color filter CFB.

The red color filter CFR may overlap with the first light emitting area LA1, and may selectively transmit red light. The green color filter CFG may overlap with the second light emitting area LA2, and may selectively transmit green light.

The blue color filter CFB may overlap with the third light emitting area LA3, and may selectively transmit blue light.

In an embodiment, each of the red color filter CFR, the green color filter CFG, and the blue color filter CFB may be disposed to further overlap with the light blocking area BA. In other words, as shown in FIG. 3, the red color filter CFR may overlap with the first light-emitting area LA1 and the light-blocking area BA, and may not overlap with the second and third light-emitting areas LA2 and LA3. The green color filter CFG may overlap with the second light-emitting area LA2 and the light-blocking area BA, and may not overlap with the first and third light-emitting areas LA1 and LA3. The blue color filter CFB may overlap with the third light-emitting area LA3 and the light-blocking area BA, and may not overlap with the first and second light-emitting areas LA1 and LA2. In this case, at (e.g., in or on) the light blocking area BA, portions of the red, green, and blue color filters CFR, CFG, and CFB may overlap with each other in the first direction D1. Accordingly, color mixing between adjacent first to third light emitting areas LA1, LA2, and LA3 may be prevented or substantially prevented.

The color filter layer CF may be disposed under (e.g., underneath) the second substrate SUB2, and may selectively further overlap with the second area A2 and the third area A3. In other words, the color filter layer CF may extend from the first area A1 to the second area A2 and the third area A3. However, the present disclosure is not limited thereto.

A portion of the color filter layer CF overlapping with the second area A2 and the third area A3 may serve as a light blocking member. At (e.g., in or on) the second area A2 and the third area A3, the green color filter CFG, the red color filter CFR, and the blue color filter CFB may overlap with each other in the first direction D1. Accordingly, at (e.g., in or on) the second area A2 and the third area A3, the color filter layer CF may effectively block light from being emitted in the first direction D1.

For example, at (e.g., in or on) the second area A2 and the third area A3, the blue color filter CFB may be disposed on a lower surface of the second substrate SUB2, the red color filter CFR may be disposed under (e.g., underneath) the blue color filter CFB, and the green color filter CFG may be disposed under (e.g., underneath) the red color filter CFR. However, an arrangement order thereof according to the present disclosure is not limited thereto.

At (e.g., in or on) the second area A2 and the third area A3, the color filter layer CF may prevent or substantially prevent a circuit structure, such as lines and a driving circuit disposed at (e.g., in or on) the second area A2 of the first substrate 100, from being visually recognized from the outside of the display device 10. In addition, the color filter layer CF may prevent or substantially prevent light leakage of light reflected from the circuit structure, or of light emitted from the first area A1, through the second area A2 and the third area A3 of the second substrate SUB2.

The partition structure PT may be disposed at (e.g., in or on) the first area A1 under (e.g., underneath) the color filter layer CF. A plurality of openings may be formed in (e.g., may penetrate) the partition structure PT. For example, as shown in FIG. 3, the openings of the partition structure PT may expose the first to third light emitting areas LA1, LA2, and LA3, respectively. The partition structure PT may form a space for accommodating an ink composition in a process of forming the color conversion layer CCL. For example, the partition structure PT may entirely overlap with the light blocking area BA, and may have a grid shape in the plan view.

In an embodiment, the partition structure PT may include an organic material. In an embodiment, the partition structure PT may further include a light blocking material. For example, at least a portion of the partition structure PT may include a light blocking material, such as a black pigment, dye, or carbon black.

In an embodiment, the low refractive index layer LRL may be disposed under (e.g., underneath) the color filter layer CF. The low refractive index layer LRL may overlap with the first area A1. For example, the low refractive index layer LRL may cover the color filter layer CF overlapping with the first area A1 and the second area A2 under (e.g., underneath) the second substrate SUB2.

The low refractive index layer LRL may have a lower refractive index than that of the color conversion layer CCL. The low refractive index layer LRL may improve light extraction efficiency to increase a luminance and a lifetime of the display device 10.

In an embodiment, the low refractive index layer LRL may include hollow particles. The hollow particles may be dispersed in a resin matrix. The hollow particles may include an inorganic material. For example, the hollow particles may include silica ($SiO_2$), magnesium fluoride ($MgF_2$), iron oxide ($Fe_3O_4$), or a suitable combination thereof. The resin matrix may include an acrylic resin, a siloxane-based resin, a urethane-based resin, an imide-based resin, and/or the like, and may be selected in consideration of a desired refractive index and fairness.

In an embodiment, the low refractive index layer LRL may have a metal ion concentration of less than about 1 atomic percentage (at %). The metal ion included in the low refractive index layer LRL may move together when external moisture moves. When the low refractive index layer LRL has a metal ion concentration of about 1 at % or more, external moisture introduced through the low refractive index layer LRL may move toward the lower substrate 100 together with the metal ion. This may increase the parasitic capacitance. Accordingly, the low refractive index layer LRL may have the metal ion concentration of less than about 1 at %, and in some embodiments, may have the metal ion concentration closer to 0 at %.

The protective layer PL may be disposed on a lower surface of the low refractive index layer LRL. For example, the protective layer PL may cover the low refractive index layer LRL. In more detail, the protective layer PL may surround (e.g., around a periphery of) a side surface LRLa of the low refractive index layer LRL, and may contact the side surface LRLa of the low refractive index layer LRL.

In an embodiment, the protective layer PL may be entirely disposed at (e.g., in or on) the first area A1, the second area A2, and the third area A3. For example, the protective layer PL may cover the color filter layer CF overlapping with the first to third areas A1, A2, and A3 on the lower surface of the low refractive index layer LRL.

In an embodiment, the protective layer PL may include an inorganic material. For example, the protective layer PL may include silicon oxide ($SiO_x$), silicon nitride ($SiN_x$), silicon oxynitride ($SiO_xN_y$), or the like. The above inorganic materials may be used alone or in a suitable combination.

The color conversion layer CCL may be disposed under (e.g., underneath) the protective layer PL, and may overlap with the first area A1. The color conversion layer CCL may include a plurality of color conversion parts disposed on a lower surface of the protective layer PL to be spaced apart from each other. In an embodiment, the color conversion layer CCL may include a first color conversion part CCL1, a second color conversion part CCL2, and a transmission part TL. The first color conversion part CCL1, the second color conversion part CCL2, and the transmission part TL may be disposed at (e.g., in or on) the first area A1 under (e.g., underneath) the color filter layer CF, and may overlap with the first to third light emitting areas LA1, LA2, and LA3, respectively. For example, the first color conversion part CCL1, the second color conversion part CCL2, and the transmission part TL may be disposed in the openings of the partition structure PT, respectively.

The first color conversion part CCL1 may overlap with the first light emitting area LA1. The first color conversion part CCL1 may convert the incident light L1 into the first transmitted light L2R having the red color. For example, the first color conversion part CCL1 may include a resin part CCL1$a$, a scatterer CCL1$b$, and a wavelength conversion particle CCL1$c$.

The scatterer CCL1$b$ may scatter the incident light L1 incident on the first color conversion part CCL1 to increase a light path without changing or substantially changing the wavelength of the incident light L1. The scatterer CCL1$b$ may include a metal oxide or an organic material. However, the present disclosure is not limited thereto, and in some embodiments, the scatterer CCL1$b$ may be omitted as needed or desired.

In an embodiment, the wavelength conversion particle CCL1$c$ may include quantum dots. The quantum dots may be defined as semiconductor materials having nanocrystals. The quantum dots may have a suitable bandgap (e.g., a specific or predetermined bandgap) according to their composition and size. Accordingly, the quantum dots may absorb the incident light L1, and may emit light having a wavelength different from that of the incident light L1. For example, the quantum dots may have a diameter of about 100 nm or less, an in more detail, about 1 nm to about 20 nm in diameter. For example, the wavelength conversion particle CCL1$c$ of the first color conversion part CCL1 may include the quantum dots that absorb the incident light L1 and emit the red light.

The scatterer CCL1$b$ and the wavelength conversion particle CCL1$c$ may be disposed in the resin part CCL1$a$. For example, the resin part CCL1$a$ may include an epoxy-based resin, an acrylic resin, a phenol-based resin, a melamine-based resin, a cardo-based resin, or an imide-based resin.

The first color conversion part CCL1 may convert the incident light L1 to emit the first transmitted light L2R having the red color. The incident light L1, which is not converted by the first color conversion part CCL1, may be blocked by the red color filter CFR. Accordingly, at (e.g., in or on) the first light emitting area LA1, the first transmitted light L2R having the red color may pass through the second substrate SUB2, and emitted to the outside (e.g., in the first direction D1).

The second color conversion part CCL2 may overlap with the second light emitting area LA2. The second color conversion part CCL2 may convert the incident light L1 into the second transmitted light L2G having the green color. For example, the second color conversion part CCL2 may include a resin part CCL2$a$, a scatterer CCL2$b$, and a wavelength conversion particle CCL2$c$. The resin part CCL2$a$ and the scatterer CCL2$b$ of the second color converter CCL2 may be the same or substantially same as (or similar to) the resin part CCL1$a$ and the scatterer CCL1$b$ of the first color converter CCL1.

For example, the wavelength conversion particle CCL2$c$ of the second color conversion part CCL2 may include quantum dots that absorb the incident light L1 and emit green light. Accordingly, the second color conversion part CCL2 may convert the incident light L1 to emit the second transmitted light L2R having the green color. The incident light L1 that is not converted by the second color conversion part CCL2 may be blocked by the green color filter CFG. Accordingly, at (e.g., in or on) the second light emitting area LA2, the second transmitted light L2G having the green color may pass through the second substrate SUB2, and emitted to the outside (e.g., in the first direction D1).

The transmission part TL may overlap with the third light emitting area LA3. The transmission part TL may transmit the incident light L1 to emit the third transmitted light L2B. For example, the transmission part TL may include a resin part TLa and a scatterer TLb. The resin part TLa and the scatterer TLb of the transmission part TL may be the same or substantially the same as (or similar to) the resin part CCL1a and the scatterer CCL1b of the first color conversion part CCL1.

However, the present disclosure is not limited thereto, and the transmission part TL may convert the incident light L1 into the third transmitted light L2B having the blue color. In this case, the transmission part TL may further include wavelength conversion particles including quantum dots that absorb the incident light L1 and emit blue light.

A portion of the incident light L1 may be blocked by the blue color filter CFB. Accordingly, at (e.g., in or on) the third light emitting area LA3, the third transmitted light L2B having the blue color may pass through the second substrate SUB2, and emitted to the outside (e.g., in the first direction D1).

As in the first to third light emitting areas LA1, LA2, and LA3, the first to third transmitted lights L2R, L2G, and L2B that are emitted to the outside through the second substrate SUB2 are combined with each other, and an image may be displayed at (e.g., in or on) the first area A1.

The capping layer CP may be disposed under (e.g., underneath) the protective layer PL. The capping layer CP may protect the color conversion layer CCL from oxygen, moisture, foreign substances, and/or the like. The capping layer CP may be entirely disposed at (e.g., in or on) the first area A1, the second area A2, and the third area A3. For example, the capping layer CP may cover the color filter layer CF, the low refractive index layer LRL, the protective layer PL, the partition structure PT, and the color conversion layer CCL. The capping layer CP may surround (e.g., around a periphery of) a side surface of the protective layer PL.

Figure 4:
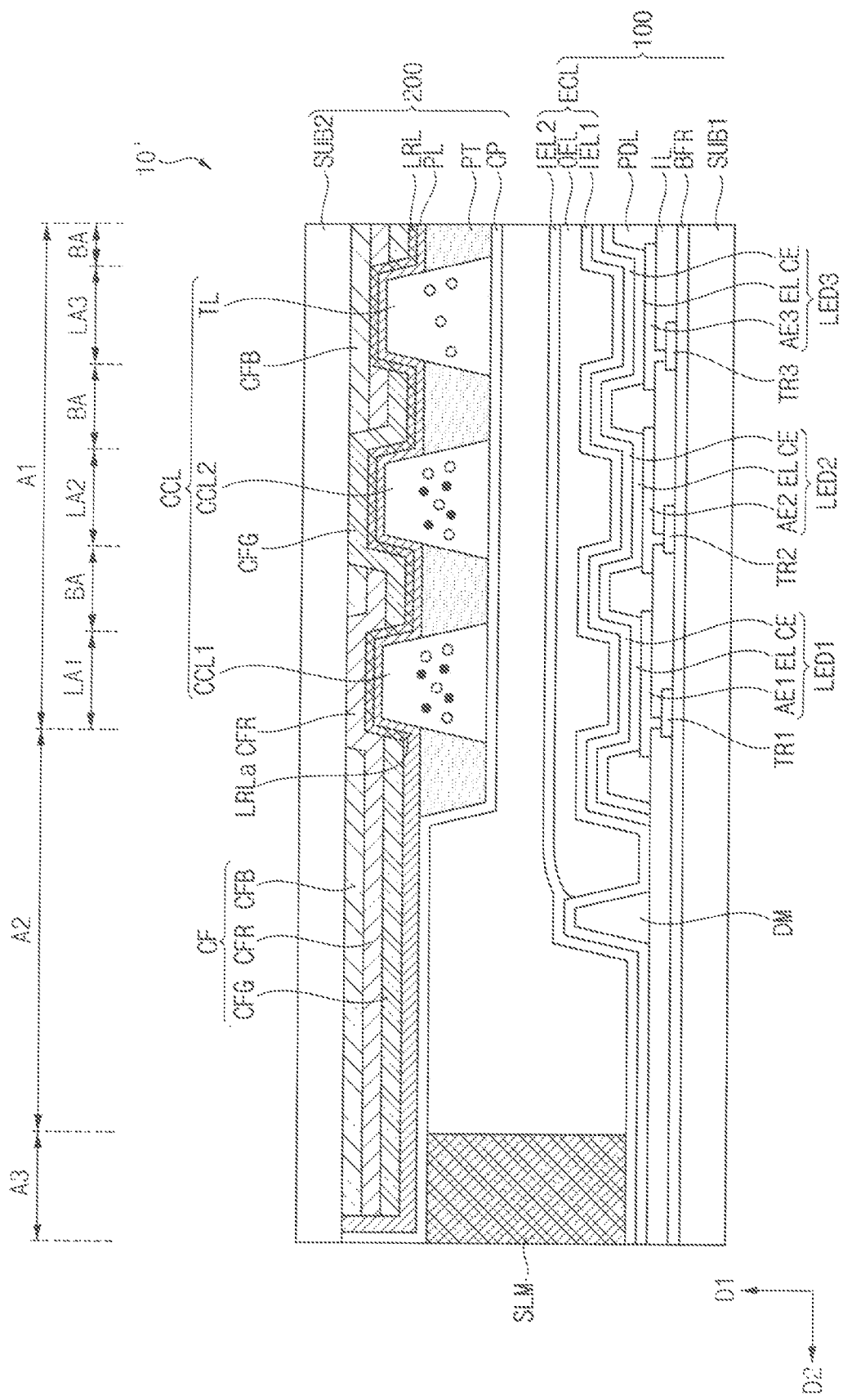
FIG. 4 is a cross-sectional view illustrating another example of the area A shown in FIG. 3.

FIG. 4 is a cross-sectional view illustrating another example of the area A shown in FIG. 3.

Referring to FIGS. 3 and 4, in an embodiment, the low refractive index layer LRL included in the display devices 10 and 10' may be spaced apart from the sealing member SLM in the plan view. The low refractive index layer LRL may overlap with the first area A1, and may not overlap with the third area A3. In more detail, the low refractive index layer LRL shown in FIG. 3 may be disposed between the color conversion layer CCL and the color filter layer CF at (e.g., in or on) the first area A1, and may be disposed under (e.g., underneath) the lower surface of the color filter layer CF at (e.g., in or on) the second area A2.

The low refractive index layer LRL may entirely overlap with the second area A2 (e.g., see FIG. 3). As another example, the low refractive index layer LRL may partially overlap with the second area A2, or may not overlap with the second area A2 (e.g., see FIG. 4). Accordingly, the side surface LRLa of the low refractive index layer LRL may be disposed between a boundary between the first area A1 and the second area A2 and a boundary between the second area A2 and the third area A3, or may not be disposed at (e.g., in or on) the second area A2.

The color filter layer CF may overlap with the sealing member SLM at (e.g., in or on) the third area A3. The color filter layer CF may extend from the first area A1 and the second area A2 in the second direction D2.

In an embodiment, the protective layer PL may cover the low refractive index layer LRL at (e.g., in or on) the first area A1 and the second area A2, and may cover the color filter layer CF at (e.g., in or on) the third area A3. The protective layer PL may surround (e.g., around a periphery of) the side surface LRLa of the low refractive index layer LRL at (e.g., in or on) the second area A2, and may surround (e.g., around a periphery of) the side surface of the color filter layer CF at (e.g., in or on) the third area A3. Accordingly, the protective layer PL may prevent or substantially prevent the low refractive index layer LRL and the color filter layer CF from being exposed to the outside.

In an embodiment, the low refractive index layer LRL may be formed on the color filter layer CF during a manufacturing process of the display devices 10 and 10'. A portion of the low refractive index layer LRL overlapping with the third area A3 may be removed through a patterning process. The protective layer PL may be formed on the low refractive index layer LRL to cover the low refractive index layer LRL.

In an embodiment, as the low refractive index layer LRL included in the display devices 10 and 10' is spaced apart from the sealing member SLM in the plan view, and the protective layer PL prevents or substantially prevents the low refractive index layer LRL from being exposed to the outside by covering the low refractive index layer LRL, the display devices 10 and 10' may prevent or substantially prevent external moisture from entering through the low refractive index layer LRL. Accordingly, the reliability of the display devices 10 and 10' may be improved by preventing or substantially preventing defects in the display devices 10 and 10'.

Figure 5:
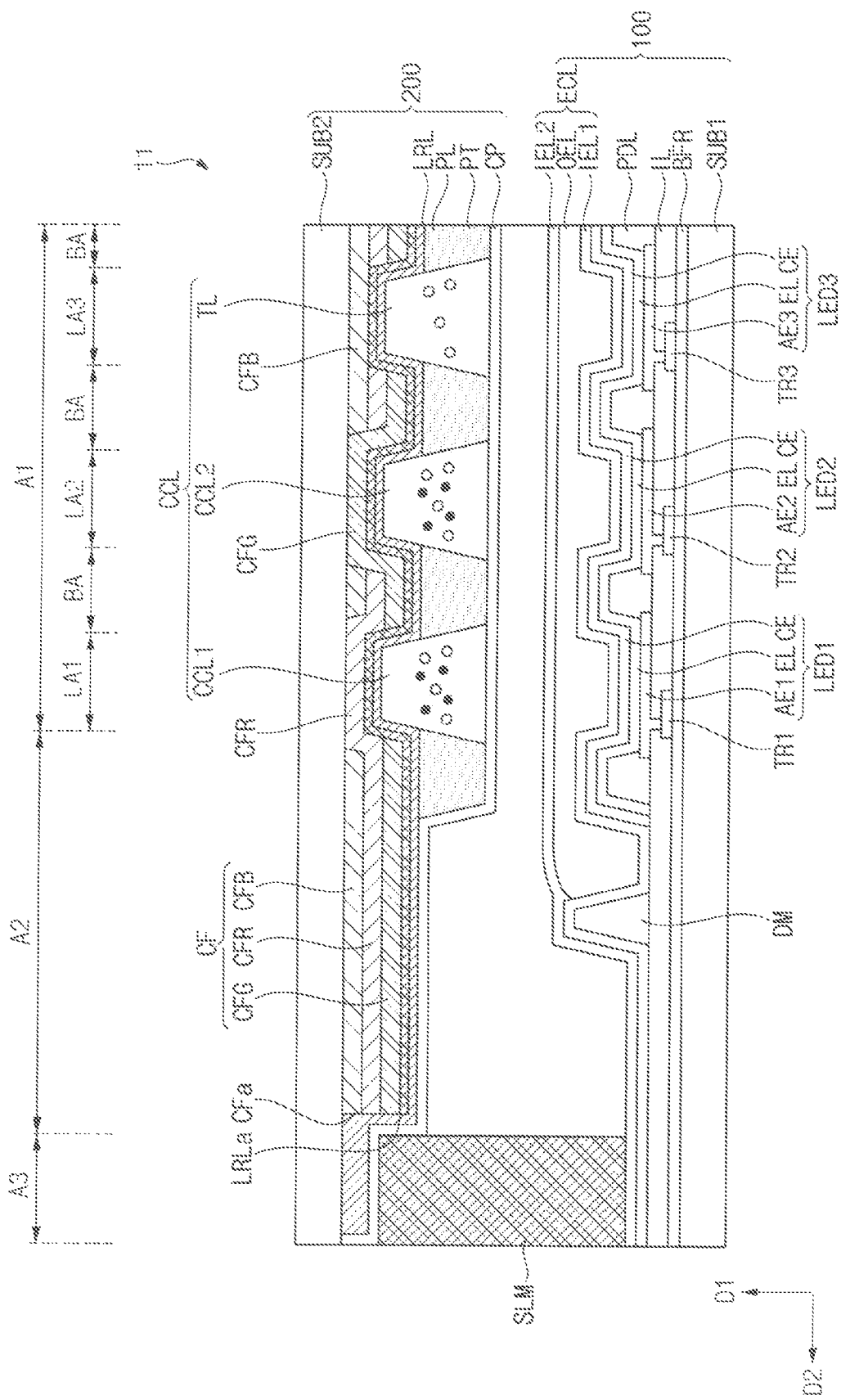
FIGS. 5-6 are cross-sectional views illustrating a display device according to various embodiments.
Figure 6:
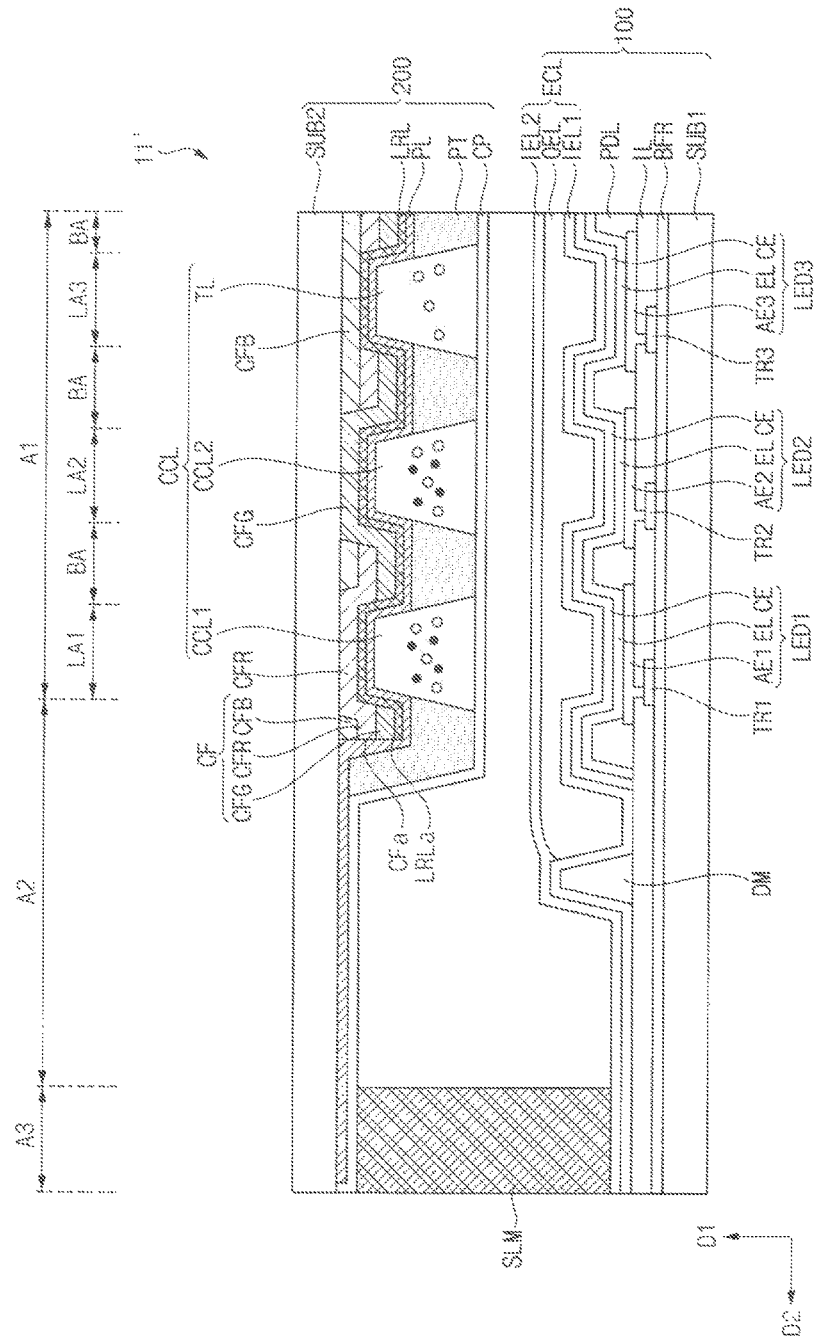

FIGS. 5 and 6 are cross-sectional views illustrating a display device according to various embodiments.

For example, from among the display devices 11 and 11' described in more detail below with reference to FIGS. 5 and 6, redundant description of the same or substantially the same configuration as those of the display devices 10 and 10' described above with reference to FIGS. 3 and 4 may not be repeated.

Referring to FIGS. 5 and 6, in an embodiment, the color filter layer CF included in the display device 11 and 11' may be spaced apart from the sealing member SLM in a plan view. Similarly, the low refractive index layer LRL may be spaced apart from the sealing member SLM in the plan view. The color filter layer CF and the low refractive index layer LRL may not overlap with the third area A3.

The low refractive index layer LRL and the color filter layer CF may entirely overlap with the second area A2 (e.g., see FIG. 5). As another example, the low refractive index layer LRL and the color filter layer CF may partially overlap with the second area A2, or may not overlap with the second area A2 (e.g., see FIG. 6). Accordingly, the side surface LRLa of the low refractive index layer LRL and the side surface CFa of the color filter layer CF may be disposed between the boundary between the first area A1 and the second area A2 and the boundary between the second area A2 and the third area A3, or may not be disposed at (e.g., in or on) the second area A2.

In an embodiment, the protective layer PL may cover the low refractive index layer LRL at (e.g., in or on) the first area A1 and the second area A2. The protective layer PL may surround (e.g., around peripheries of) the side surface LRLa of the low refractive index layer LRL and the side surface CFa of the color filter layer CF at (e.g., in or on) the second area A2. Accordingly, the low refractive index layer LRL and the color filter layer CF may not be exposed to the outside by the protective layer PL. In addition, the capping layer CP may cover the protective layer PL.

Figure 7:
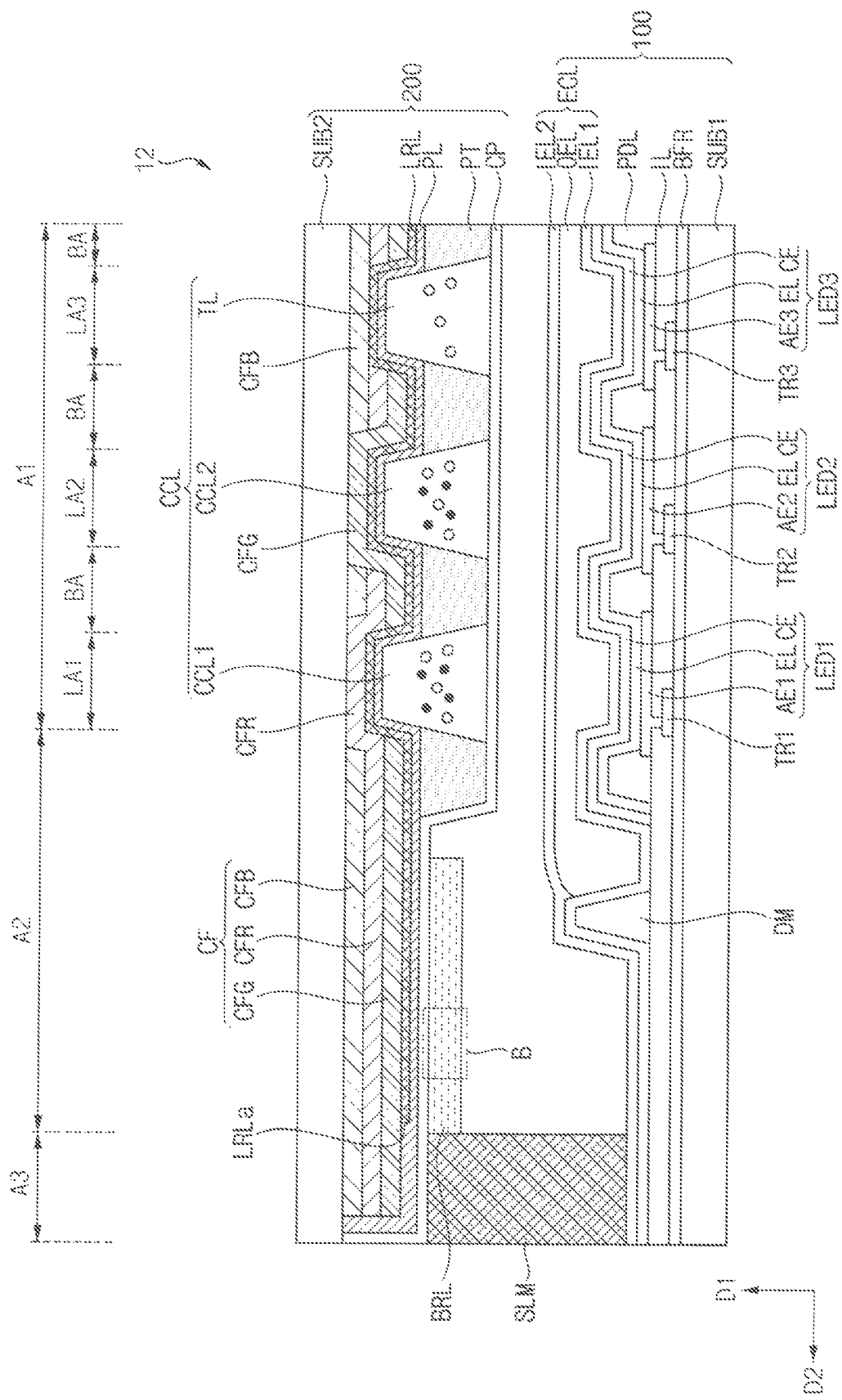
FIG. 7 is a cross-sectional view illustrating a display device according to an embodiment.

FIG. 7 is a cross-sectional view illustrating a display device according to an embodiment.

For example, in the display device 12 described in more detail below with reference to FIG. 7, redundant description of the same or substantially the same configuration as that of the display device 10 described above with reference to FIG. 3 may not be repeated.

Referring to FIG. 7, the upper substrate 200 included in the display device 12 may further include a barrier layer BRL. The barrier layer BRL may be disposed under (e.g., underneath) the protective layer PL. In more detail, the barrier layer BRL may be disposed on a lower surface of the capping layer CP.

The barrier layer BRL may overlap with the second area A2. The barrier layer BRL may protect the lower substrate 100 from external moisture at (e.g., in or on) the second area A2.

The barrier layer BRL may not be disposed at (e.g., in or on) the first area A1, and may be spaced apart from the color conversion layer CCL in a plan view. The barrier layer BRL may not be disposed at (e.g., in or on) the third area A3, and may be spaced apart from (or located at a side of) the sealing member SLM on a plane (e.g., in a plan view). In other words, the barrier layer BRL may not overlap with the color conversion layer CCL and the sealing member SLM.

In an embodiment, the barrier layer BRL may include at least one organic layer, or at least one inorganic layer. The barrier layer BRL may have a single-layer structure or a multi-layered structure.

Figure 8:
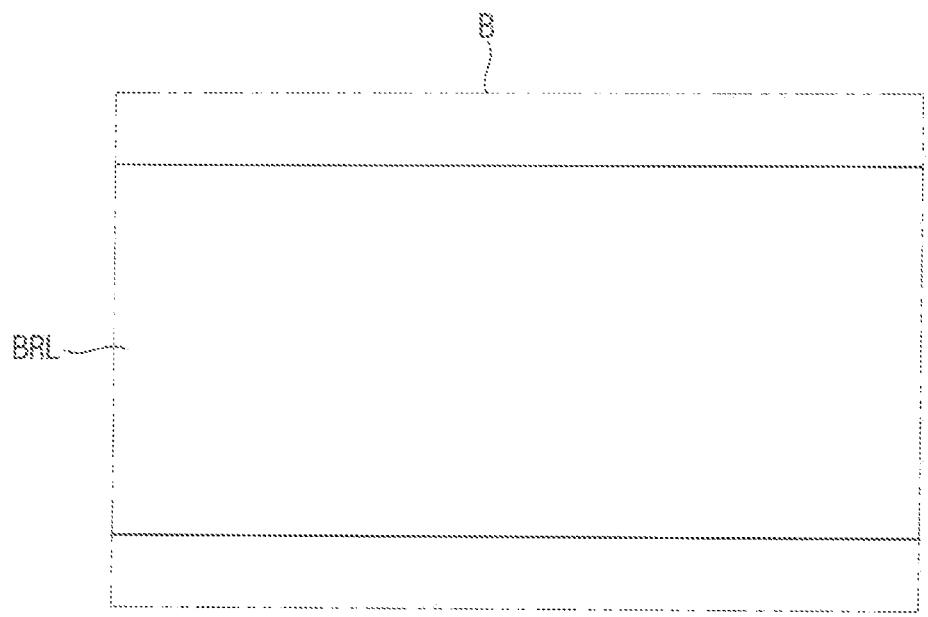
FIGS. 8-10 are enlarged cross-sectional views illustrating the area B of FIG. 7.
Figure 9:
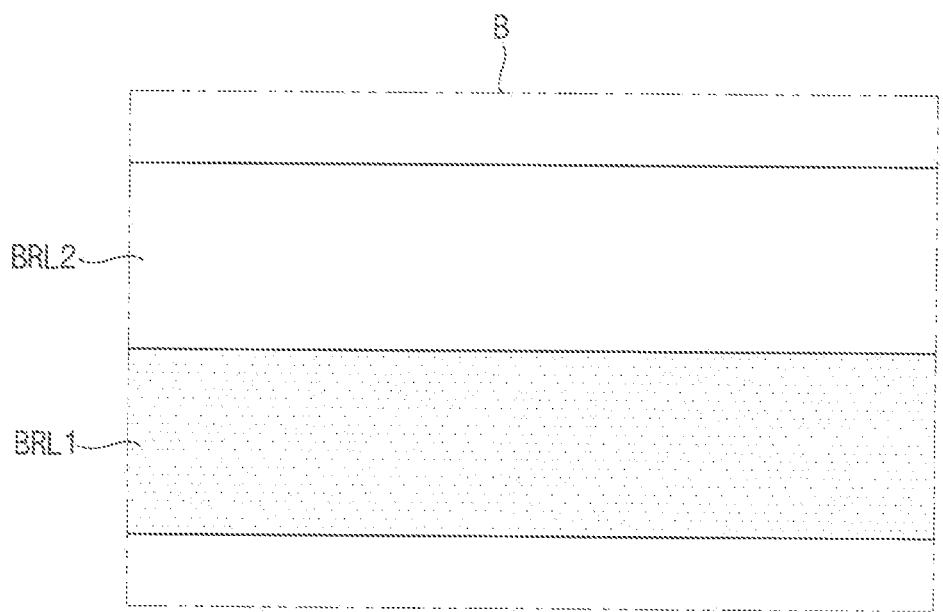
Figure 10:
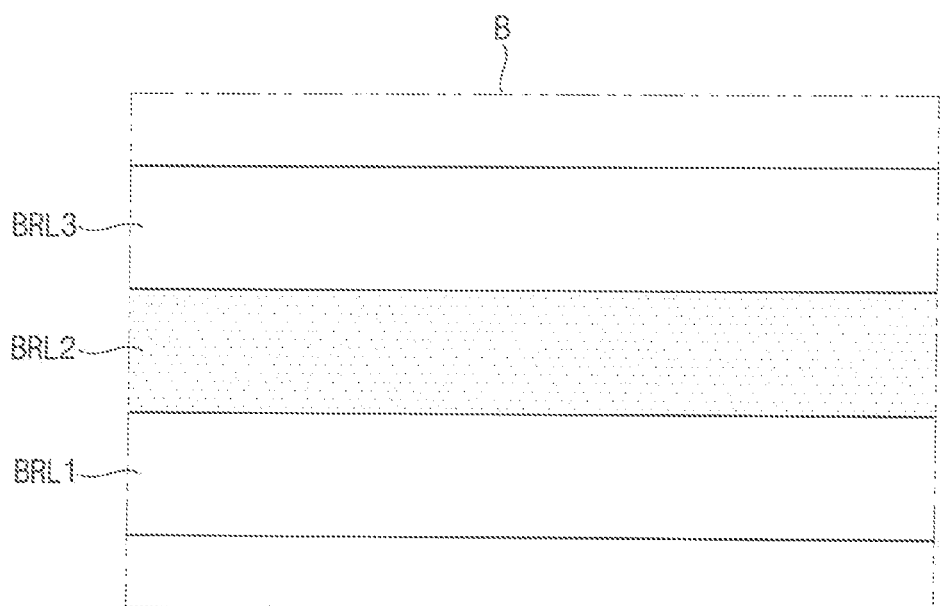

FIGS. 8 through 10 are enlarged cross-sectional views illustrating the area B of FIG. 7.

Referring to FIG. 8, the barrier layer BRL may have the single-layer structure. For example, the barrier layer BRL may be an organic layer including an organic material. Examples of the organic material constituting the barrier layer BRL may include a polyimide-based material, an acrylate-based material, an epoxy-based material, a siloxane-based material, propylene glycol monomethyl etheracetate (PGMEA), poly (methyl methacrylate) (PMMA), poly(melamine-co-formaldehyde)methylated (PMF), PVP-co-PMMA, P(VDF-TrFE), c-PVP, and/or the like. The above organic materials may be used alone or in a suitable combination.

As another example, the barrier layer BRL may be an inorganic layer including an inorganic material. Examples of the inorganic material constituting the barrier layer BRL may include SixNy, SixOy, SixOyNz, HfOx, AlxOy, ZrOx, Zr—Al2O3, HfLaO, TiO2, ZAO, p-SiOx, ZnO, In$_2$O$_3$, Ga$_2$O$_3$, InON, ITO, IZO, IGO, ITGO, IGZO, ITGZO, AlZO, and/or the like. The above inorganic materials may be used alone or in a suitable combination.

Referring further to FIG. 9, the barrier layer BRL may have the multi-layered structure. For example, the barrier layer BRL may include a first barrier layer BRL1, and a second barrier layer BRL2 disposed on the first barrier layer BRL1.

The barrier layer BRL may include both an organic layer and an inorganic layer. For example, the first barrier layer BRL1 may be the organic layer. Examples of the organic material constituting the first barrier layer BRL1 may include a polyimide-based material, an acrylate-based material, an epoxy-based material, a siloxane-based material, propylene glycol monomethyl etheracetate (PGMEA), poly (methyl methacrylate) (PMMA), poly(melamine-co-formaldehyde)methylated (PMF), PVP-co-PMMA, P(VDF-TrFE), c-PVP, and/or the like. The above organic materials may be used alone or in a suitable combination.

For example, the second barrier layer BRL2 may be the inorganic layer. Examples of the inorganic material constituting the second barrier layer BRL2 may include SixNy, SixOy, SixOyNz, HfOx, AlxOy, ZrOx, Zr—Al$_2$O$_3$, HfLaO, TiO$_2$, ZAO, p-SiOx, ZnO, In$_2$O$_3$, Ga$_2$O$_3$, InON, ITO, IZO, IGO, ITGO, IGZO, ITGZO, AlZO, and/or the like. The above inorganic materials may be used alone or in a suitable combination.

However, the present disclosure is not limited thereto, and the first barrier layer BRL1 may be the inorganic layer, and the second barrier layer BRL2 may be the organic layer.

Referring further to FIG. 10, the barrier layer BRL may have a multi-layered structure. For example, the barrier layer BRL may include the first barrier layer BRL1, the second barrier layer BRL2 disposed on the first barrier layer BRL1, and a third barrier layer BRL3 disposed on the second barrier layer BRL2.

The barrier layer BRL may include both the organic layer and the inorganic layer, and may have a structure in which the organic layer and the inorganic layer are alternately stacked on one another. For example, the first barrier layer BRL1 may be the organic layer, the second barrier layer BRL2 may be the inorganic layer, and the third barrier layer BRL3 may be the organic layer. As another example, the first barrier layer BRL1 may be the inorganic layer, the second barrier layer BRL2 may be the organic layer, and the third barrier layer BRL3 may be the inorganic layer.

However, the present disclosure is not limited thereto, and the barrier layer BRL may have a multi-layered structure in which three or more layers are stacked on one another.

Referring back to FIG. 7, in an embodiment, the barrier layer BRL may be formed on the capping layer CP during a manufacturing process of the display device 12. A portion of the barrier layer BRL overlapping with the first area A1 and the third area A3 may be removed through a patterning process.

In an embodiment, because the display device 12 further includes the barrier layer BRL, the barrier layer BRL may prevent or substantially prevent moisture entering through the barrier layer BRL of the upper substrate 200 from moving toward the lower substrate 100. Accordingly, reliability of the display device 12 may be improved by preventing or substantially preventing defects of the display device 12.

Figure 11:
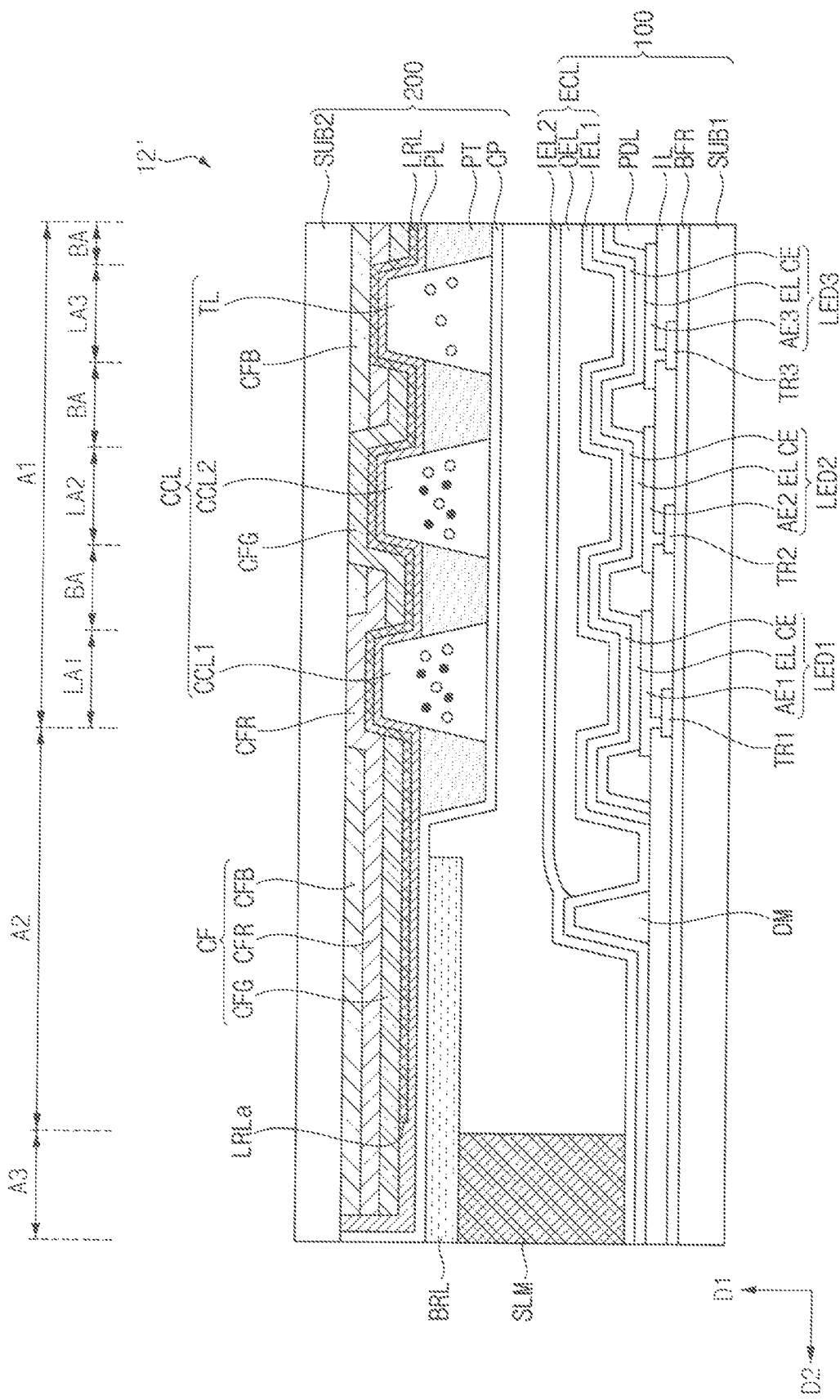
FIG. 11 is a cross-sectional view illustrating another example of the display device of FIG. 7.

FIG. 11 is a cross-sectional view illustrating another example of the display device of FIG. 7.

Referring to FIG. 11, the upper substrate 200 included in the display device 12' may further include a barrier layer BRL. The barrier layer BRL may overlap with the second area A2 and the third area A3. The barrier layer BRL may be disposed at (e.g., in or on) the third area A3, and may overlap with the sealing member SLM. In other words, the barrier layer BRL may be disposed between the sealing member SLM and the capping layer CP at (e.g., in or on) the third area A3. The barrier layer BRL may not be disposed at (e.g., in or on) the first area A1, and may not overlap with the color conversion layer CCL.

Figure 12:
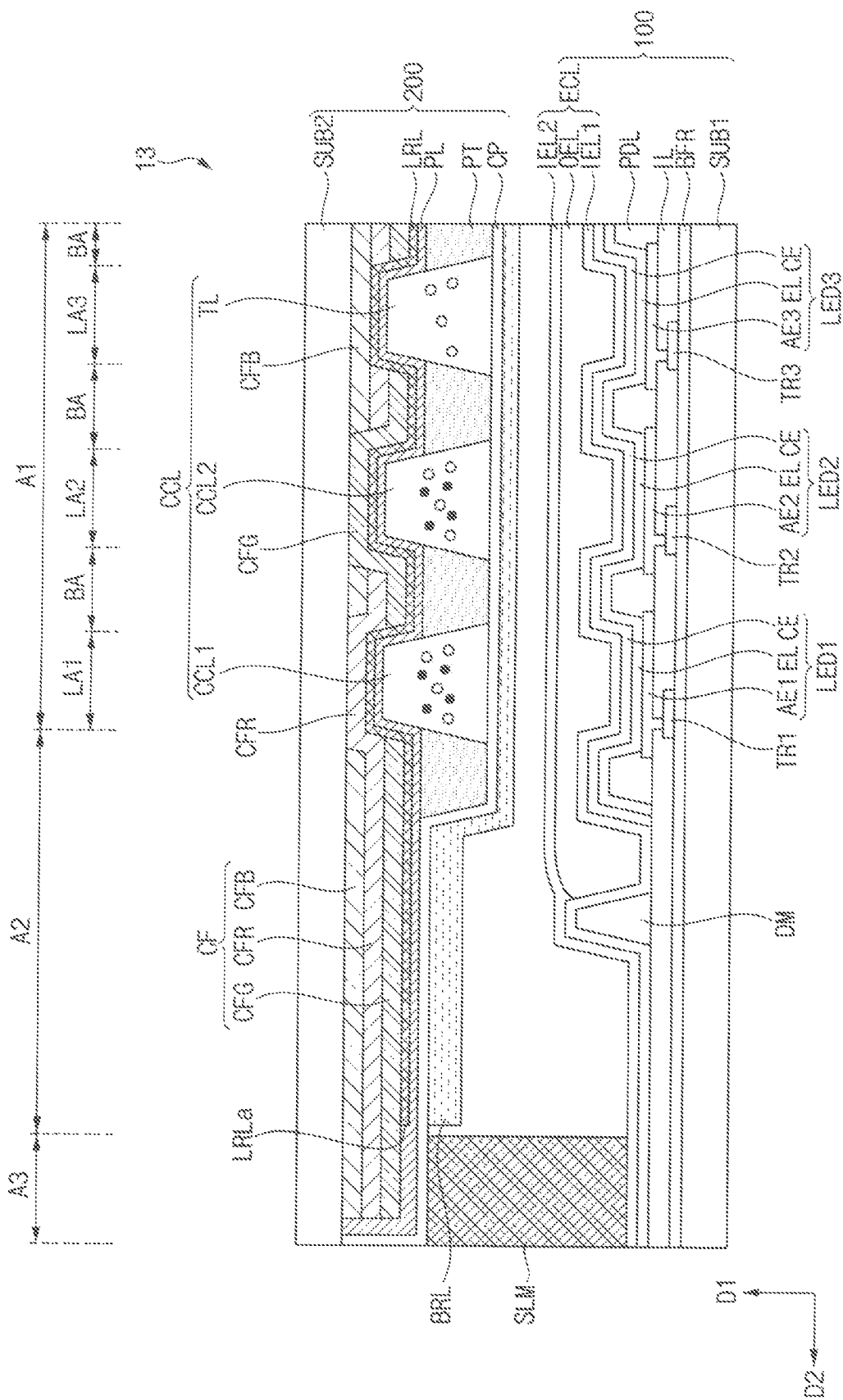
FIG. 12 is a cross-sectional view illustrating a display device according to an embodiment.

FIG. 12 is a cross-sectional view illustrating a display device according to an embodiment.

Referring to FIG. 12, the upper substrate 200 included in the display device 13 may further include a barrier layer BRL. The barrier layer BRL may be disposed under (e.g., underneath) the protective layer PL. In more detail, the barrier layer BRL may be disposed on a lower surface of the capping layer CP.

The barrier layer BRL may overlap with the first area A1 and the second area A2. At least a portion of the barrier layer BRL may overlap with the color conversion layer CCL, and the portion (e.g., overlapping with the color conversion layer CCL) of the barrier layer BRL may be disposed under (e.g., underneath) the color conversion layer CCL at (e.g., in or on) the first area A1. In other words, the barrier layer BRL may be entirely disposed at (e.g., in or on) the first area A1, or optionally, the barrier layer BRL may be disposed partially at (e.g., in or on) the first area A1 as needed or desired.

At (e.g., in or on) the first area A1 and the second area A2, the barrier layer BRL may cover the color conversion layer CCL and the low refractive index layer LRL on the lower surface of the capping layer CP.

The barrier layer BRL may not be disposed at (e.g., in or on) the third area A3, and may be spaced apart from the sealing member SLM in a plan view. In other words, the barrier layer BRL may not overlap with the sealing member SLM.

Figure 13:
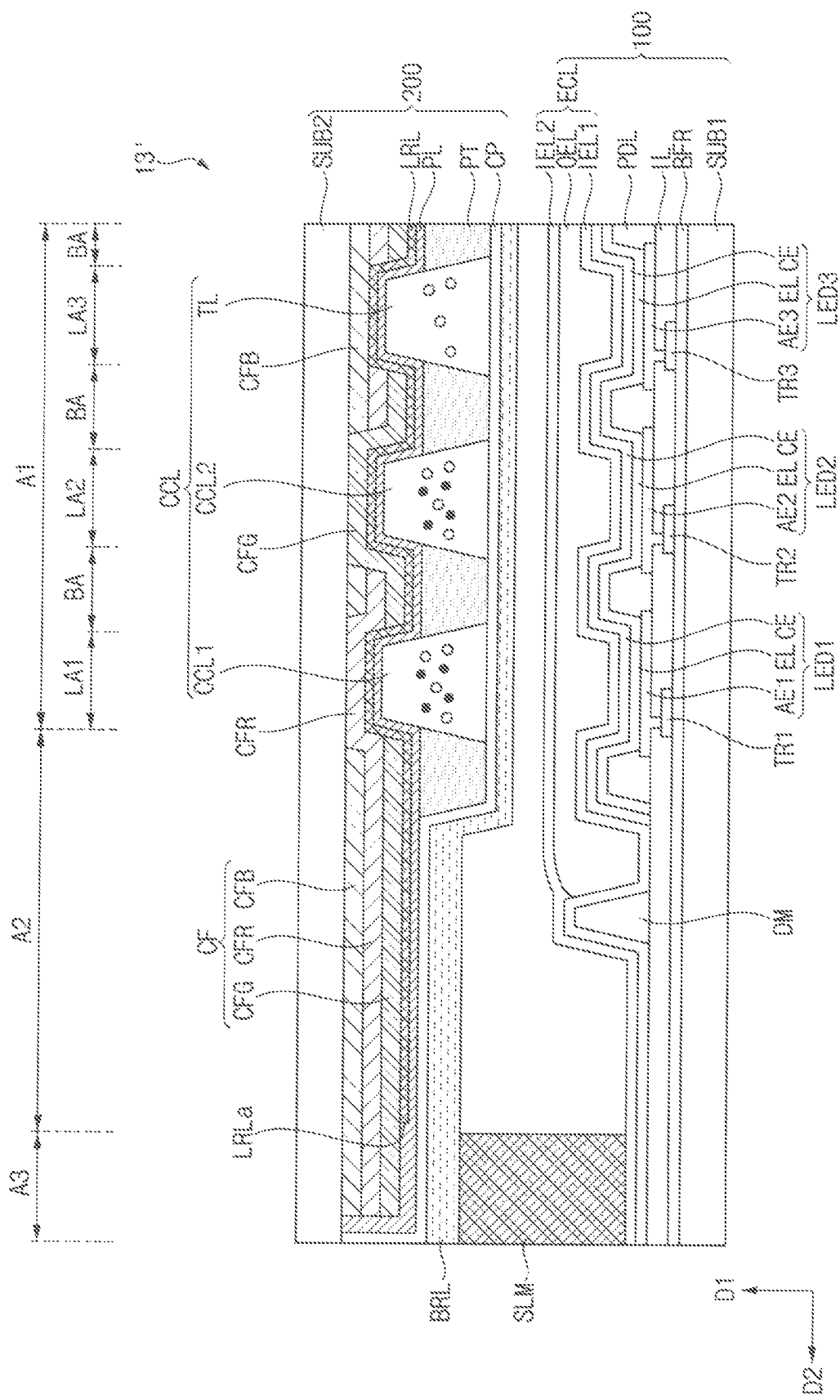
FIG. 13 is a cross-sectional view illustrating another example of the display device of FIG. 12.

FIG. 13 is a cross-sectional view illustrating another example of the display device of FIG. 12.

Referring to FIG. 13, the barrier layer BRL included in the display device 13' may entirely overlap with the first area A1, the second area A2, and the third area A3. As another example, the barrier layer BRL may partially overlap with the first area A1. Unlike the display device 13 of FIG. 12, the barrier layer BRL may be disposed at (e.g., in or on) the third area A3, and may overlap with the sealing member SLM. In other words, the barrier layer BRL may be disposed between the sealing member SLM and the capping layer CP at (e.g., in or on) the third area A3.

However, the present disclosure is not limited thereto, and in FIGS. 12 and 13, the barrier layer BRL may not overlap with the first area A1, and may be spaced apart from the color conversion layer CCL in the plan view (e.g., see FIGS. 7 and 11).

Figure 14:
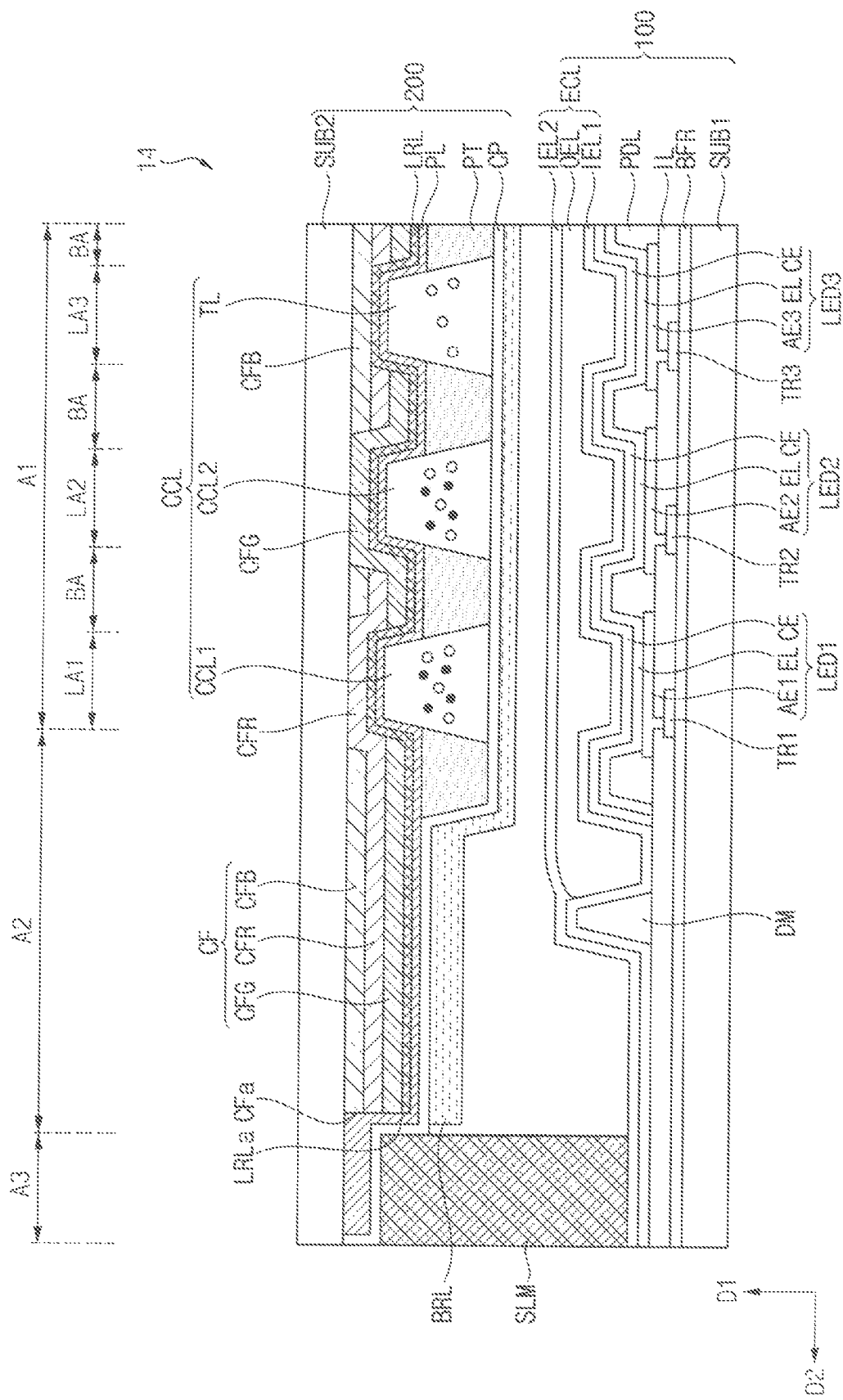
FIG. 14 is a cross-sectional view illustrating a display device according to an embodiment.

FIG. 14 is a cross-sectional view illustrating a display device according to an embodiment.

For example, in the display device 14 described in more detail below with reference to FIG. 14, redundant description of the same or substantially the same configuration as that of the display device 11 described above with reference to FIG. 5 may not be repeated.

Referring to FIG. 14, in an embodiment, the color filter layer CF included in the display device 14 may be spaced apart from the sealing member SLM in a plan view. Similarly, the low refractive index layer LRL may be spaced apart from the sealing member SLM in the plan view. The protective layer PL may cover the low refractive index layer LRL and the color filter layer CF.

The barrier layer BRL may overlap with the first area A1 and the second area A2. At least a portion of the barrier layer BRL may overlap with the color conversion layer CCL. In other words, the barrier layer BRL may be entirely disposed at (e.g., in or on) the first area A1, but optionally, the barrier layer BRL may be partially disposed at (e.g., in or on) the first area A1 as needed or desired. The barrier layer BRL may not be disposed at (e.g., in or on) the third area A3, and may be spaced apart from the sealing member SLM in the plan view.

Figure 15:
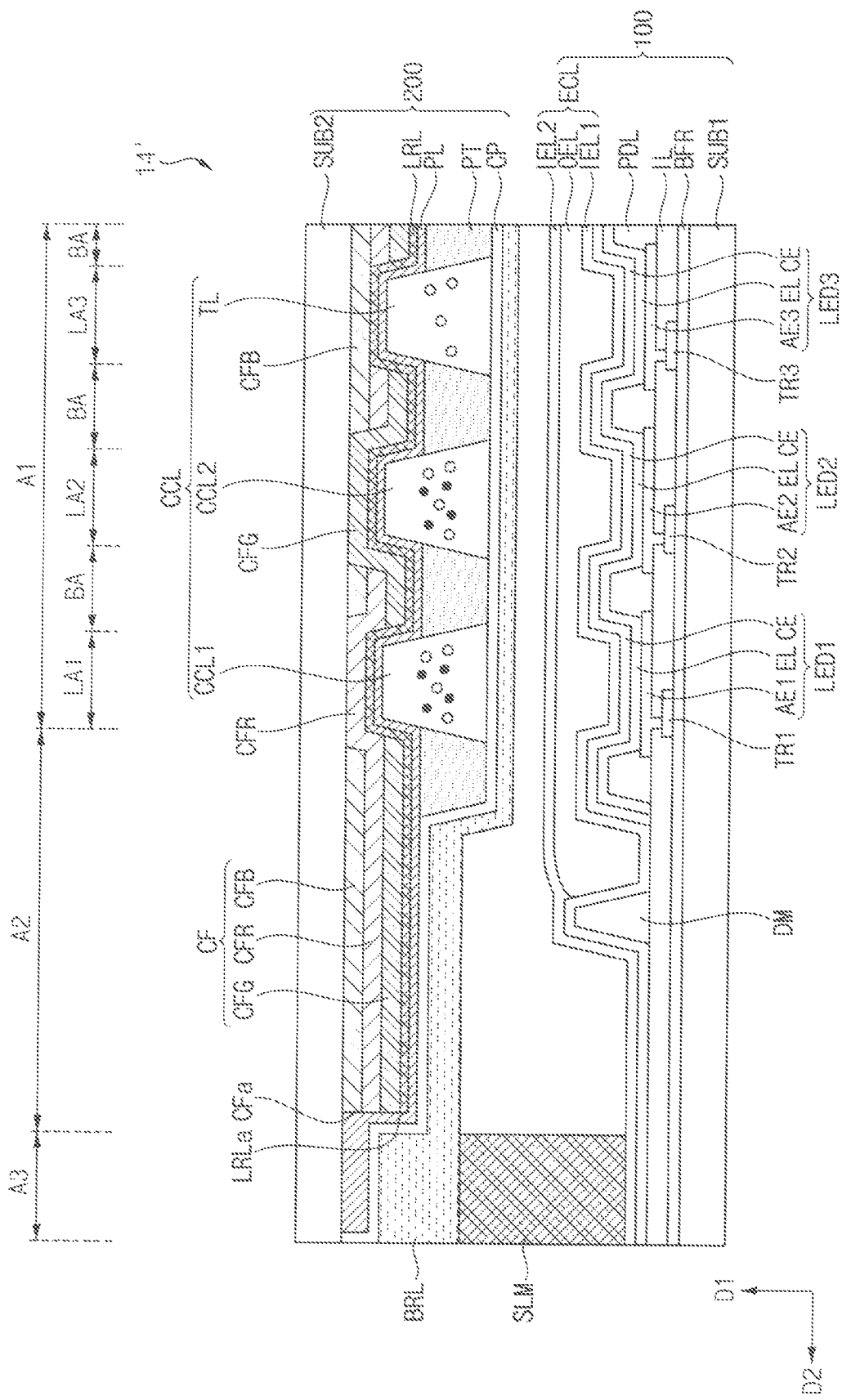
FIG. 15 is a cross-sectional view illustrating another example of the display device of FIG. 14.

FIG. 15 is a cross-sectional view illustrating another example of the display device of FIG. 14.

Referring to FIG. 15, the barrier layer BRL included in the display device 14' may entirely overlap with the first area A1, the second area A2, and the third area A3. As another example, the barrier layer BRL may partially overlap with the first area A1. Unlike the display device 14 of FIG. 14, the barrier layer BRL may be disposed at (e.g., in or on) the third area A3, and may overlap with the sealing member SLM.

However, the present disclosure is not limited thereto, and in FIGS. 14 and 15, the barrier layer BRL may not overlap with the first area A1, and may be spaced apart from the color conversion layer CCL (e.g., see FIGS. 7 and 11).

Figure 16:
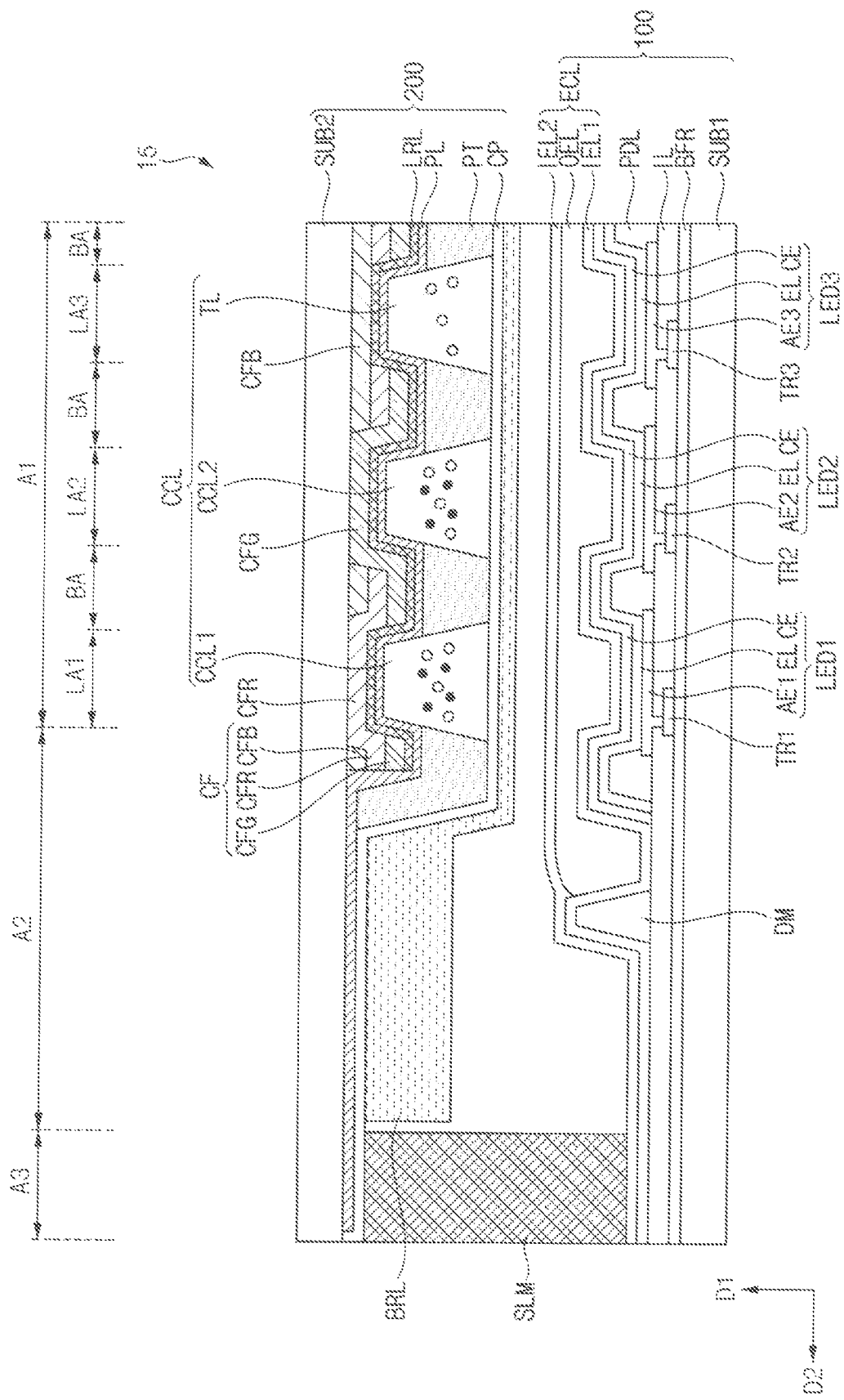
FIG. 16 is a cross-sectional view illustrating a display device according to an embodiment.

FIG. 16 is a cross-sectional view illustrating a display device according to an embodiment.

For example, in the display device 15 described in more detail below with reference to FIG. 16, redundant description of the same or substantially the same configuration as those of the display device 11' described above with reference to FIG. 6 and the display device 12 described above with reference to FIG. 7 may not be repeated.

Referring to FIG. 16, the low refractive index layer LRL and the color filter layer CF included in the display device 15 may partially overlap with the second area A2, or may not overlap with the second area A2. The side surface LRLa of the low refractive index layer LRL and the side surface CFa of the color filter layer CF may be disposed between the boundary between the first area A1 and the second area A2 and the boundary between the second area A2 and the third area A3.

The upper substrate 200 included in the display device 15 may further include a barrier layer BRL, unlike the display device 11' of FIG. 6. The barrier layer BRL may be disposed under (e.g., underneath) the protective layer PL and the capping layer CP. The barrier layer BRL may overlap with the first area A1 and the second area A2. At least a portion of the barrier layer BRL may overlap with the color conversion layer CCL, and the portion of the barrier layer BRL may be disposed under (e.g., underneath) the color conversion layer CCL. The barrier layer BRL may not be disposed at (e.g., in or on) the third area A3, and may be spaced apart from the sealing member SLM in a plan view.

Figure 17:
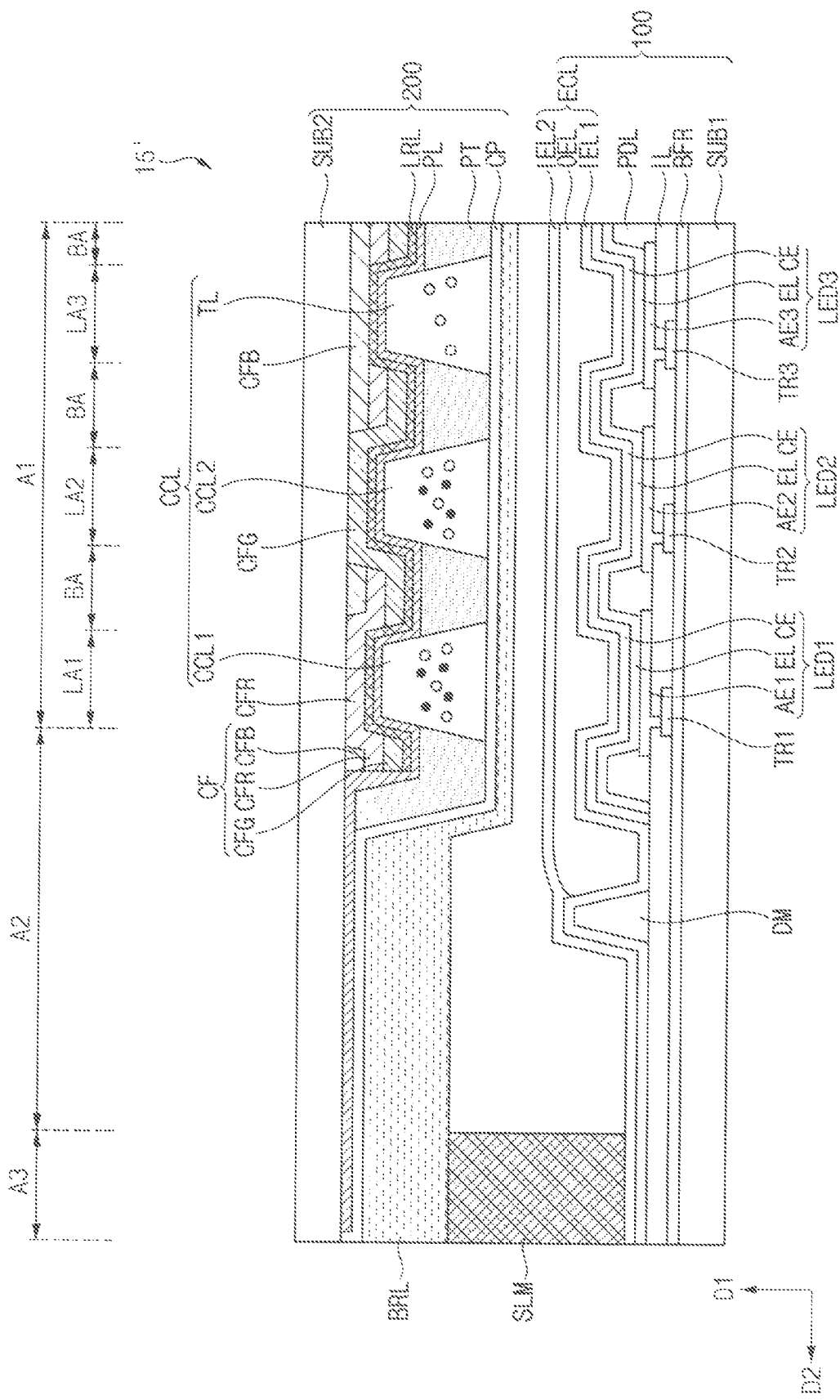
FIG. 17 is a cross-sectional view illustrating another example of the display device of FIG. 16.

FIG. 17 is a cross-sectional view illustrating another example of the display device of FIG. 16.

Referring to FIG. 17, the barrier layer BRL included in the display device 15' may overlap with the first area A1, the second area A2, and the third area A3. Unlike the display device 15 of FIG. 16, the barrier layer BRL may be disposed at (e.g., in or on) the third area A3, and may overlap with the sealing member SLM. In other words, the barrier layer BRL may be disposed between the sealing member SLM and the capping layer CP at (e.g., in or on) the third area A3.

However, the present disclosure is not limited thereto, and in FIGS. 16 and 17, the barrier layer BRL may not overlap with the first area A1, and may be spaced apart from the color conversion layer CCL (e.g., see FIGS. 7 and 11).

Figure 18:
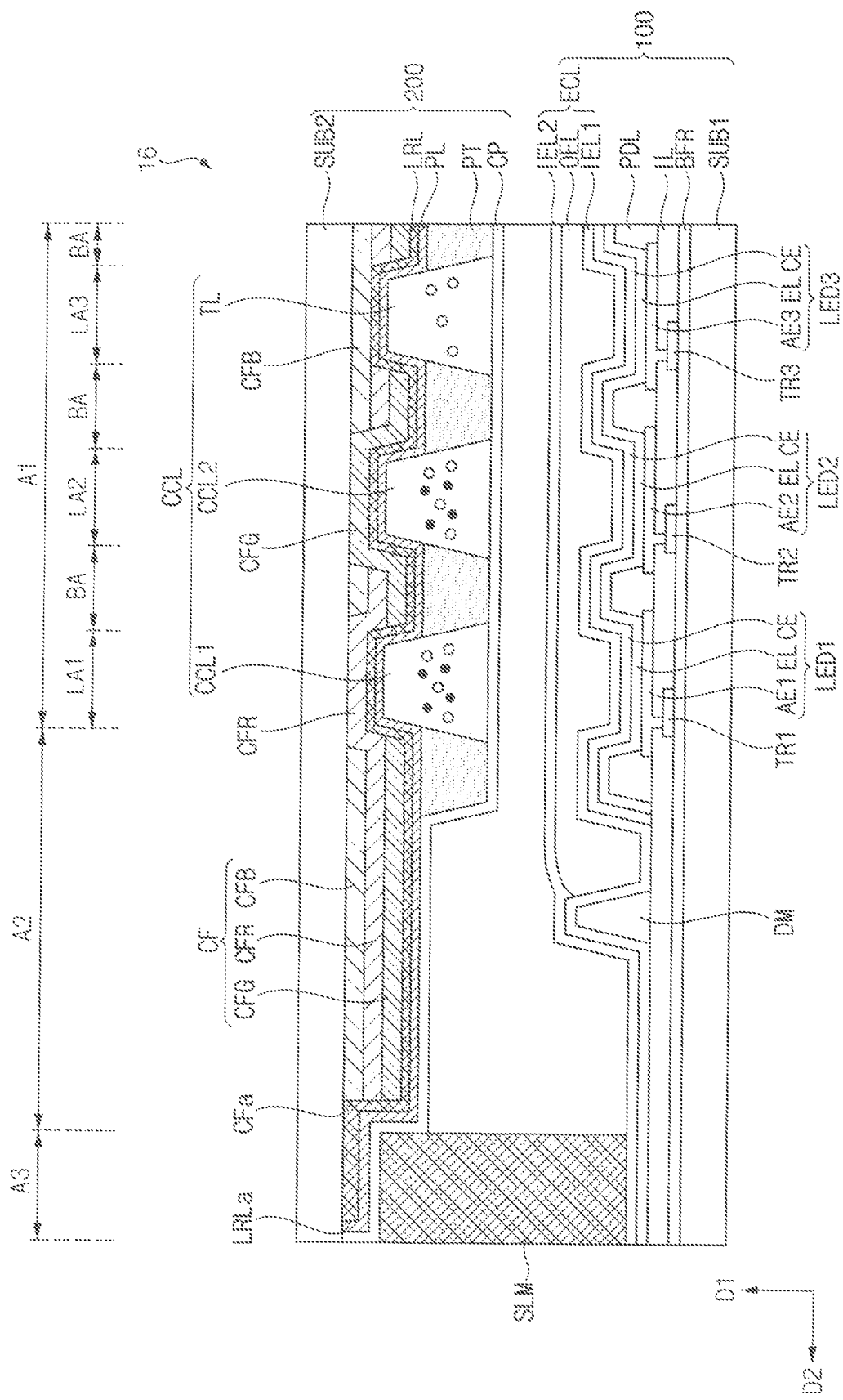
FIG. 18 is a cross-sectional view illustrating a display device according to an embodiment.

FIG. 18 is a cross-sectional view illustrating a display device according to an embodiment.

For example, in the display device 16 described in more detail below with reference to FIG. 18, redundant description of the same or substantially the same configuration as that of the display device 10 described above with reference to FIG. 3 may not be repeated.

Referring to FIG. 18, the display device 16 may include a lower substrate 100, an upper substrate 200, and a sealing member SLM. The lower substrate 100 may include a first substrate SUB1, a buffer layer BFR, first to third driving elements TR1, TR2, TR3, an insulation layer IL, a pixel defining layer PDL, first to third light emitting elements LED1, LED2, and LED3, and an encapsulation layer ECL. The upper substrate 200 may include a second substrate SUB2, a color filter layer CF, a partition structure PT, a color conversion layer CCL, a low refractive index layer LRL, a protective layer PL, and a capping layer CP.

The display device 16 may include a first area A1, a second area A2, and a third area A3, and thus, the first substrate SUB1 and the second substrate SUB2 may also include the first area A1, the second area A2, and the third area A3.

In an embodiment, the color filter layer CF may be disposed on a lower surface of the second substrate SUB2, and may be spaced apart from the sealing member SLM in a plan view. In other words, the color filter layer CF may not overlap with the third area A3.

The low refractive index layer LRL may be disposed under (e.g., underneath) the color filter layer CF at (e.g., in or on) the first area A1 and the second area A2. The low refractive index layer LRL may overlap with the color conversion layer CCL and the color filter layer CF at (e.g., in or on) the first area A1, and may overlap with the color filter layer CF at (e.g., in or on) the second area A2. The low refractive index layer LRL may surround (e.g., around a periphery of) the side surface CFa of the color filter layer CF at (e.g., in or on) the second area A2, and may contact the side surface CFa of the color filter layer CF.

In an embodiment, the low refractive index layer LRL may overlap with the sealing member SLM in the third area A3. The protective layer PL may cover the low refractive index layer LRL, and may surround (e.g., around a periphery of) the side surface LRLa of the low refractive index layer LRL at (e.g., in or on) the third area A3. The capping layer CP may cover the protective layer PL. Accordingly, the protective layer PL and the capping layer CP may prevent or substantially prevent the low refractive index layer LRL and the color filter layer CF from being exposed to the outside.

In an embodiment, the color filter layer CF may be formed on the second substrate SUB2 during a manufacturing process of the display device 16. A portion of the color filter layer CF overlapping with the third area A3 may be removed through a patterning process. The low refractive index layer LRL may cover the color filter layer CF, and may be formed on the color filter layer CF. The protective layer PL may cover the low refractive index layer LRL, and may be formed to contact the side surface LRLa of the low refractive index layer LRL.

In an embodiment, because the color filter layer CF does not overlap with the sealing member SLM, exposure of the color filter layer CF and the low refractive index layer LRL to the outside may be prevented or substantially prevented. Accordingly, moisture and the like entering through the color filter layer CF and the low refractive index layer LRL may be more effectively prevented or substantially prevented.

Figure 19:
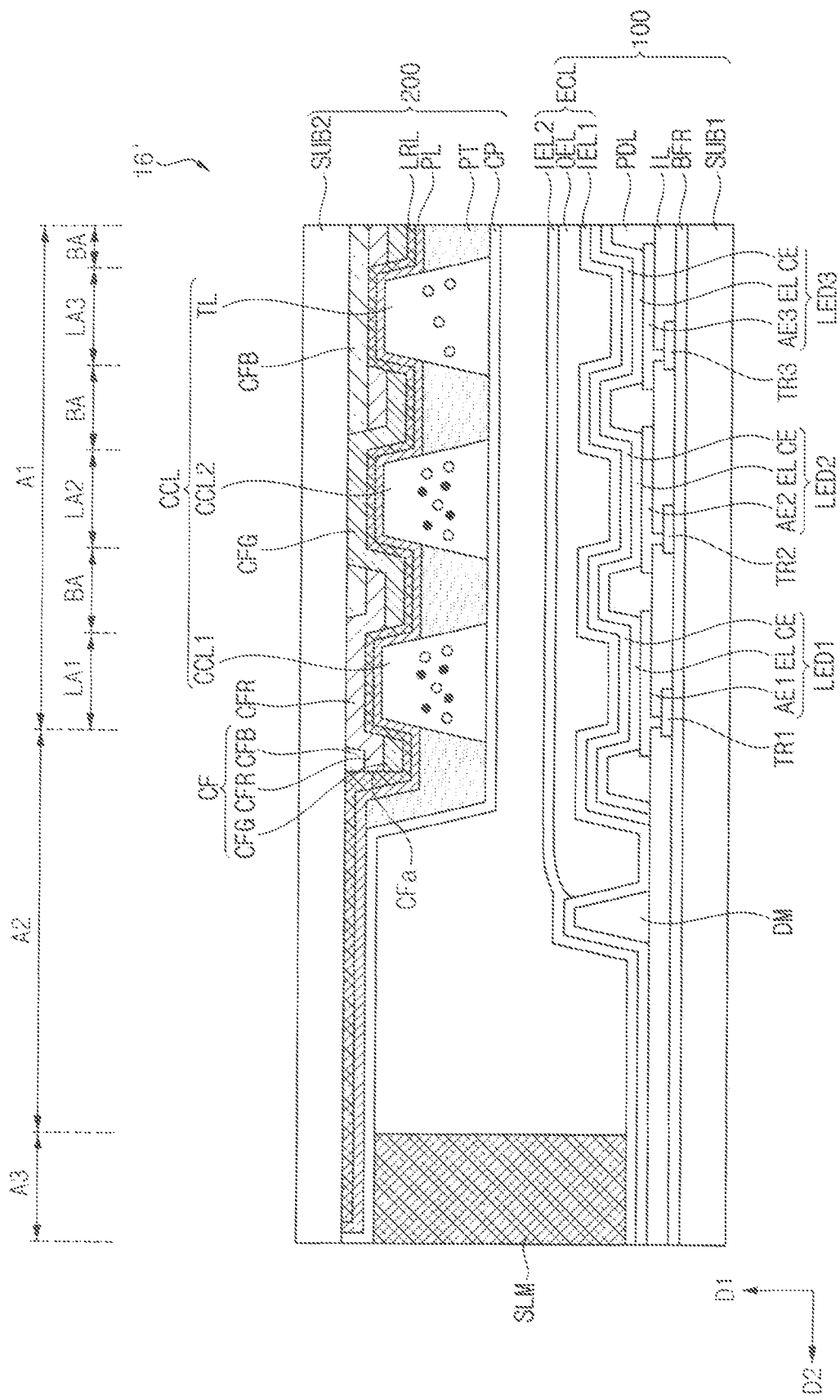
FIG. 19 is a cross-sectional view illustrating another example of the display device of FIG. 18.

FIG. 19 is a cross-sectional view illustrating another example of the display device of FIG. 18.

Referring to FIGS. 18 and 19, in an embodiment, the color filter layer CF included in display devices 16 and 16' may be spaced apart from the sealing member SLM in a plan view. The color filter layer CF may overlap with the first area A1, and may not overlap with the third area A3. In more detail, the color filter layer CF may overlap with the color conversion layer CCL at (e.g., in or on) the first area A1, and may be disposed between the color conversion layer CCL and the second substrate SUB2.

In an embodiment, the color filter layer CF may entirely overlap with the second area A2 (e.g., see FIG. 18). As another example, the color filter layer CF may partially overlap with the second area A2, or may not overlap with the second area A2 (e.g., see FIG. 19). Accordingly, the side surface CFa of the color filter layer CF may be disposed between the boundary between the first area A1 and the second area A2 and the boundary between the second area A2 and the third area A3. The low refractive index layer LRL may surround (e.g., around a periphery of) the side surface CFa of the color filter layer CF at (e.g., in or on) the second area A2, and may contact the side surface CFa of the color filter layer CF.

Figure 20:
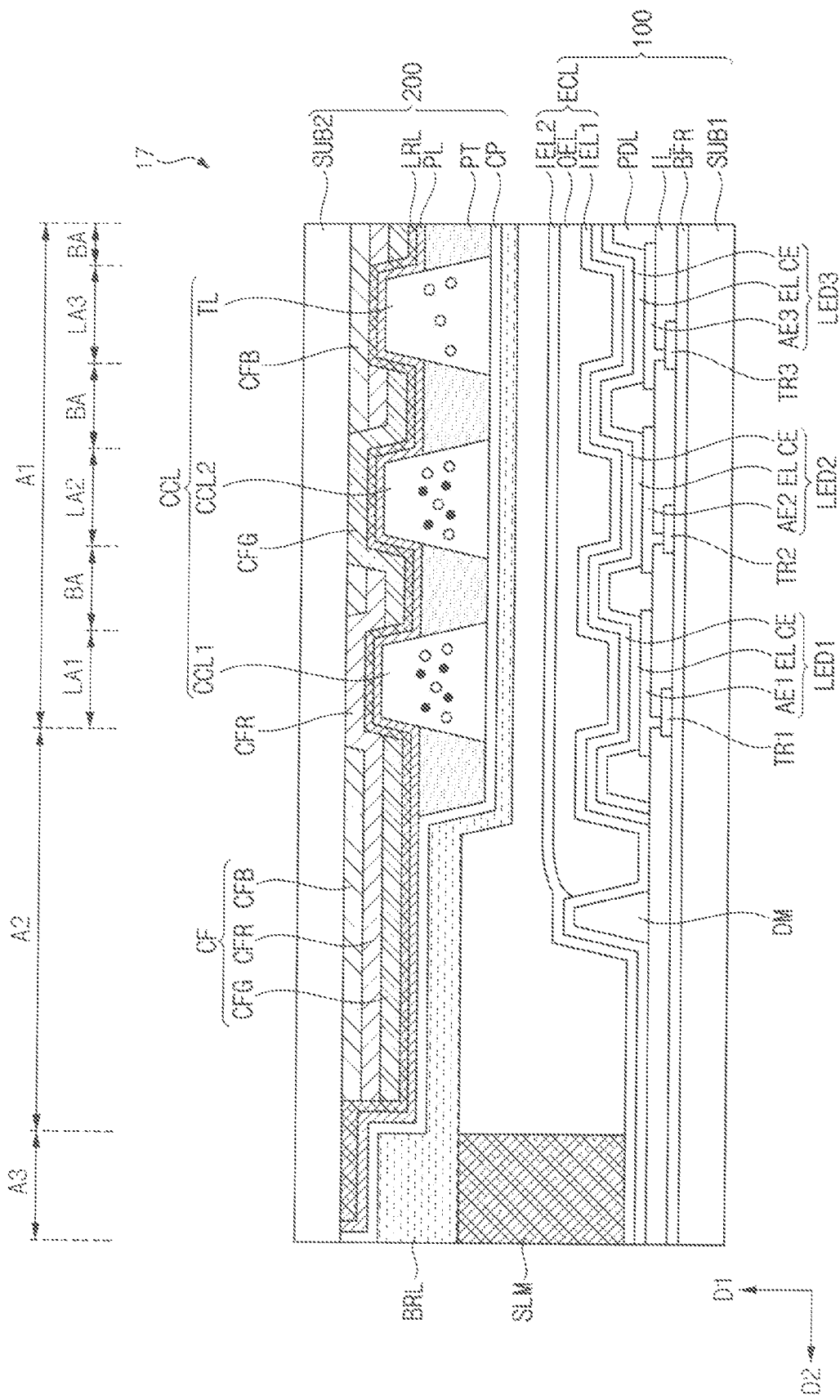
FIG. 20 is a cross-sectional view illustrating a display device according to an embodiment.

FIG. 20 is a cross-sectional view illustrating a display device according to an embodiment.

For example, in the display device 17 described in more detail below with reference to FIG. 20, redundant description of the same or substantially the same configuration as those of the display device 12 described above with reference to FIG. 7 and the display device 15' described above with reference to FIG. 18 may not be repeated.

Referring to FIG. 20, the upper substrate 200 included in the display device 17 may further include a barrier layer BRL, unlike the display device 15' of FIG. 18.

The barrier layer BRL may be disposed under (e.g., underneath) the protective layer PL and the capping layer CP. The barrier layer BRL may overlap with the second area A2.

The barrier layer BRL may overlap with the color conversion layer CCL at (e.g., in or on) the first area A1. At least a portion of the barrier layer BRL may overlap with the color conversion layer CCL, and the portion of the barrier layer BRL may be disposed under (e.g., underneath) the color conversion layer CCL. The barrier layer BRL may overlap with the first area A1, the second area A2, and the third area A3. The barrier layer BRL may be disposed at (e.g., in or on) the third area A3, and may overlap with the sealing member SLM. In other words, the barrier layer BRL may be disposed between the sealing member SLM and the capping layer CP at (e.g., in or on) the third area A3.

However, the present disclosure is not limited thereto, and the barrier layer BRL may not be disposed at (e.g., in or on) the first area A1, and may not overlap with the color conversion layer CCL (e.g., see FIG. 7).

In an embodiment, the barrier layer BRL may include at least one organic layer, or at least one inorganic layer. The barrier layer BRL may have a single-layer structure or a multi-layered structure.

Figure 21:
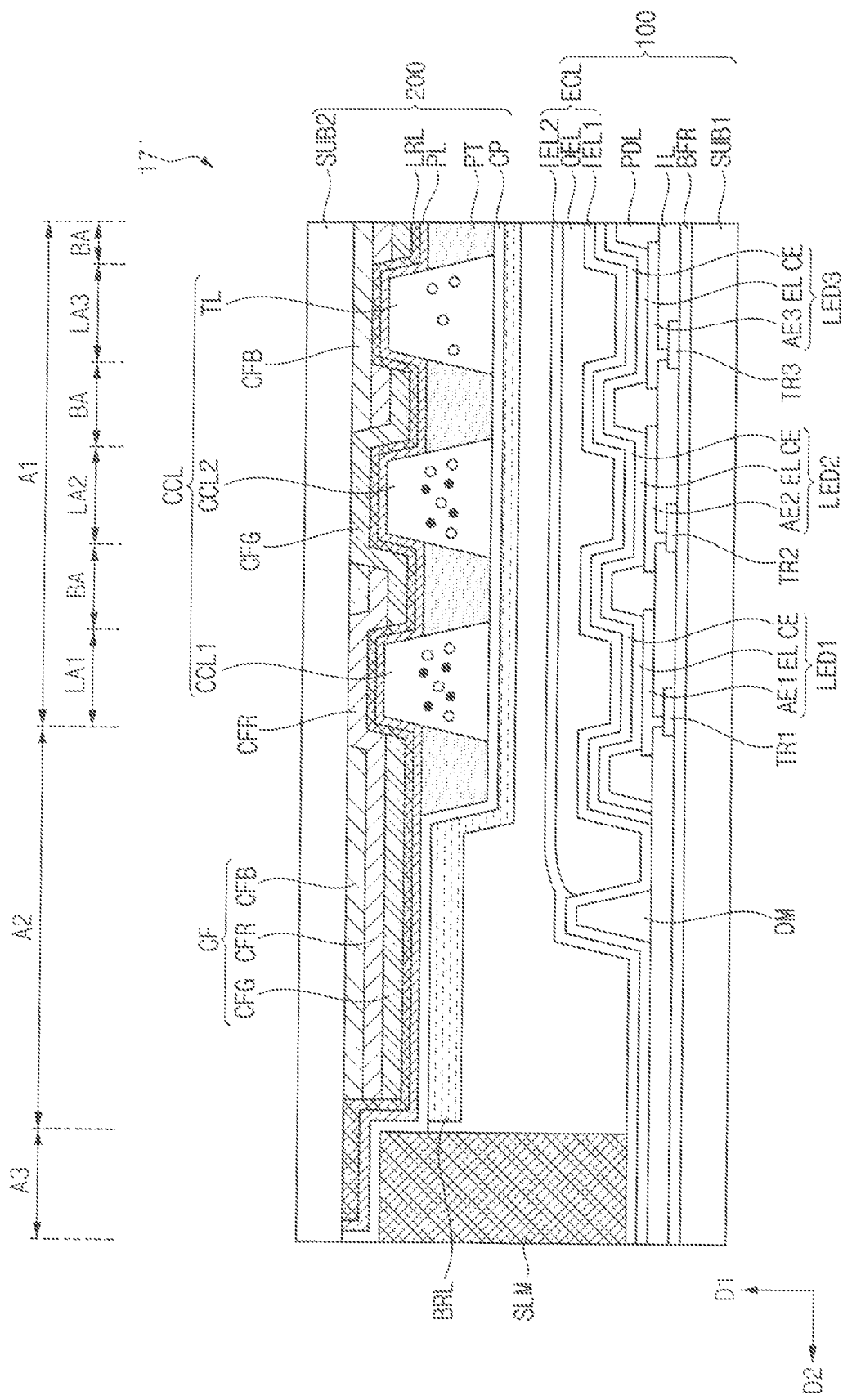
FIG. 21 is a cross-sectional view illustrating another example of the display device of FIG. 20.

FIG. 21 is a cross-sectional view illustrating another example of the display device of FIG. 20.

Referring to FIG. 21, the barrier layer BRL included in the display device 17' may not be disposed at (e.g., in or on) the third area A3, and may be spaced apart from the sealing member SLM in a plan view. Accordingly, the low refractive index layer LRL, the protective layer PL, and the capping layer CP may overlap with the sealing member SLM at (e.g., in or on) the third area A3.

However, the present disclosure is not limited thereto, and the barrier layer BRL may not be disposed at (e.g., in or on) the first area A1, and may not overlap with the color conversion layer CCL (e.g., see FIG. 11).

Figure 22:
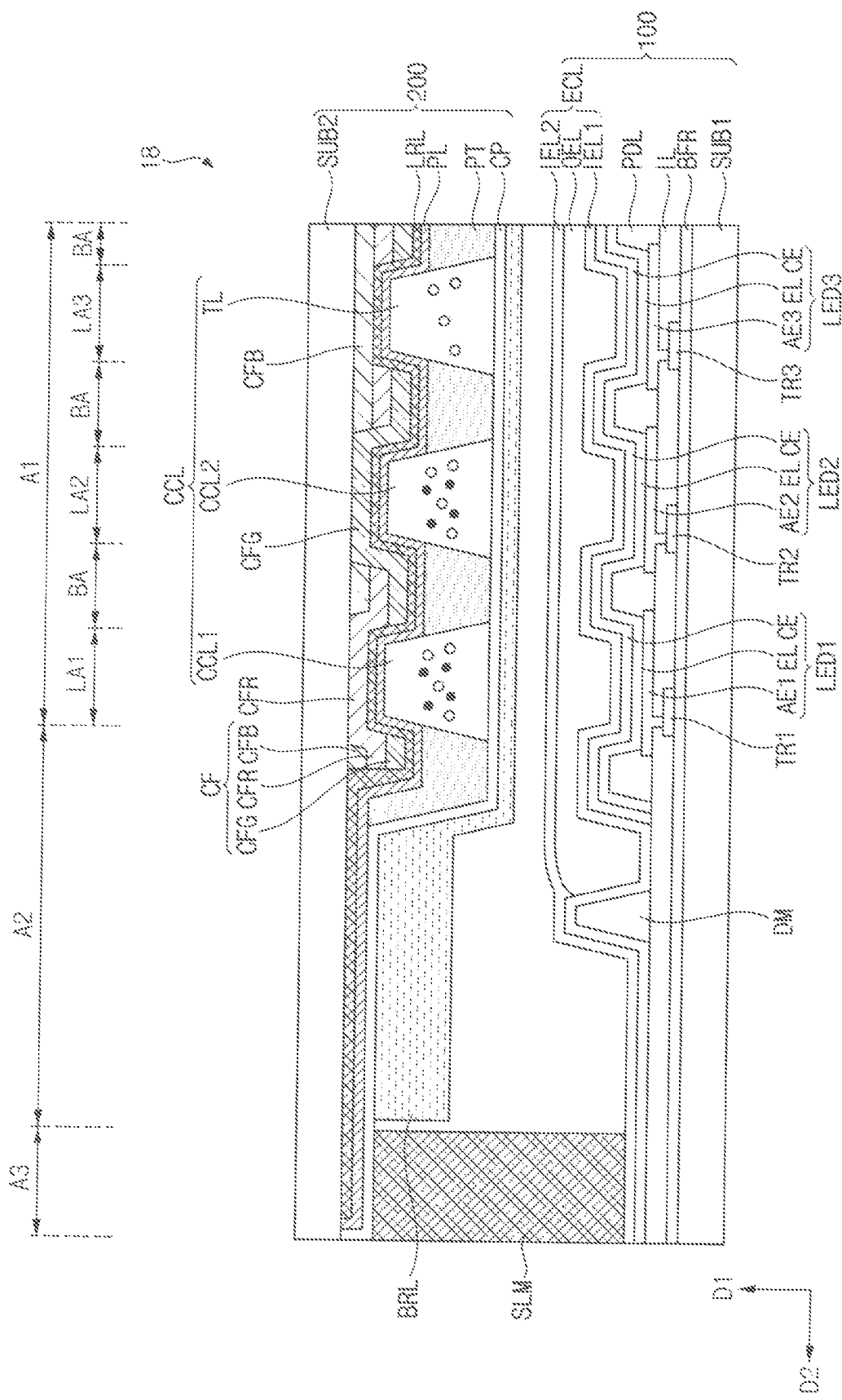
FIG. 22 is a cross-sectional view illustrating a display device according to an embodiment.

FIG. 22 is a cross-sectional view illustrating a display device according to an embodiment.

For example, in the display device 18 described in more detail below with reference to FIG. 22, redundant description of the same or substantially the same configuration as that of the display device 16' described above with reference to FIG. 19 may not be repeated.

Referring to FIG. 22, the display device 18 may include a color filter layer CF, and the color filter layer CF may be spaced apart from the sealing member SLM in a plan view. The color filter layer CF may overlap with the first area A1, and may not overlap with the third area A3. The color filter layer CF may partially overlap with the second area A2, or may not overlap with the second area A2.

Unlike the display device 16' of FIG. 19, the upper substrate 200 included in the display device 18 may further include a barrier layer BRL. The barrier layer BRL may be disposed under (e.g., underneath) the protective layer PL and the capping layer CP, and may overlap with the first area A1 and the second area A2.

The barrier layer BRL may overlap with the color conversion layer CCL and the color filter layer CF at (e.g., in or on) the first area A1. In more detail, at least a portion of the barrier layer BRL may overlap with the color conversion layer CCL, and the portion of the barrier layer BRL may be disposed under (e.g., underneath) the color conversion layer CCL. The barrier layer BRL may not be disposed at (e.g., in or on) the third area A3, and may be spaced apart from the sealing member SLM in the plan view. Accordingly, at (e.g., in or on) the third area A3, the low refractive index layer LRL, the protective layer PL, and the capping layer CP may overlap with the sealing member SLM.

Figure 23:
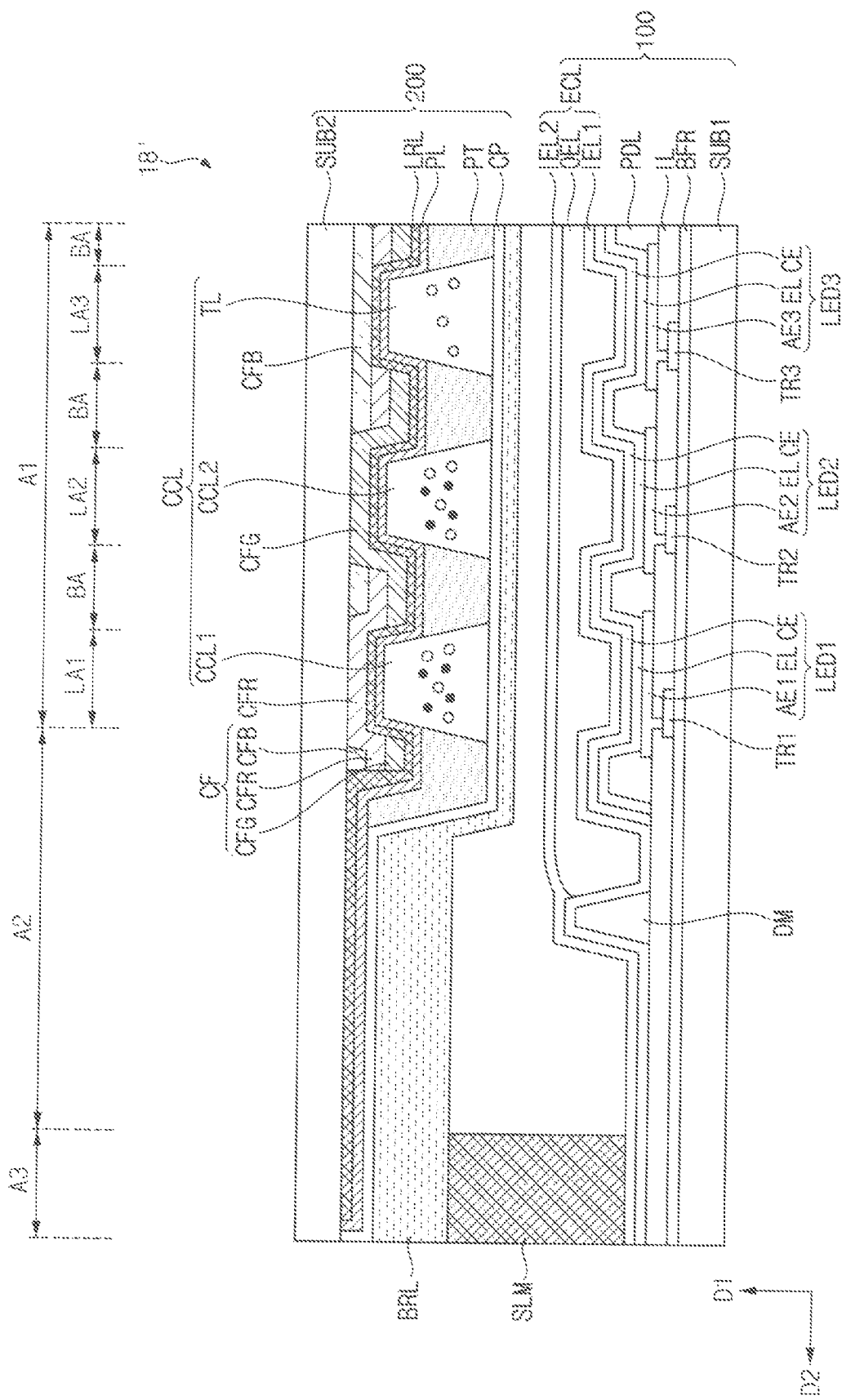
FIG. 23 is a cross-sectional view illustrating another example of the display device of FIG. 22.

FIG. 23 is a cross-sectional view illustrating another example of the display device of FIG. 22.

Referring to FIG. 23, the barrier layer BRL included in the display device 18' may overlap with the first area A1, the second area A2, and the third area A3. Unlike the display device 18 of FIG. 22, the barrier layer BRL may be disposed at (e.g., in or on) the third area A3, and may overlap with the sealing member SLM. In other words, the barrier layer BRL may be disposed between the sealing member SLM and the capping layer CP at (e.g., in or on) the third area A3.

However, the present disclosure is not limited thereto, and in FIGS. 22 and 23, the barrier layer BRL may not overlap with the first area A1, and may be spaced apart from the color conversion layer CCL in the plan view (e.g., see FIGS. 7 and 11).

Figure 24:
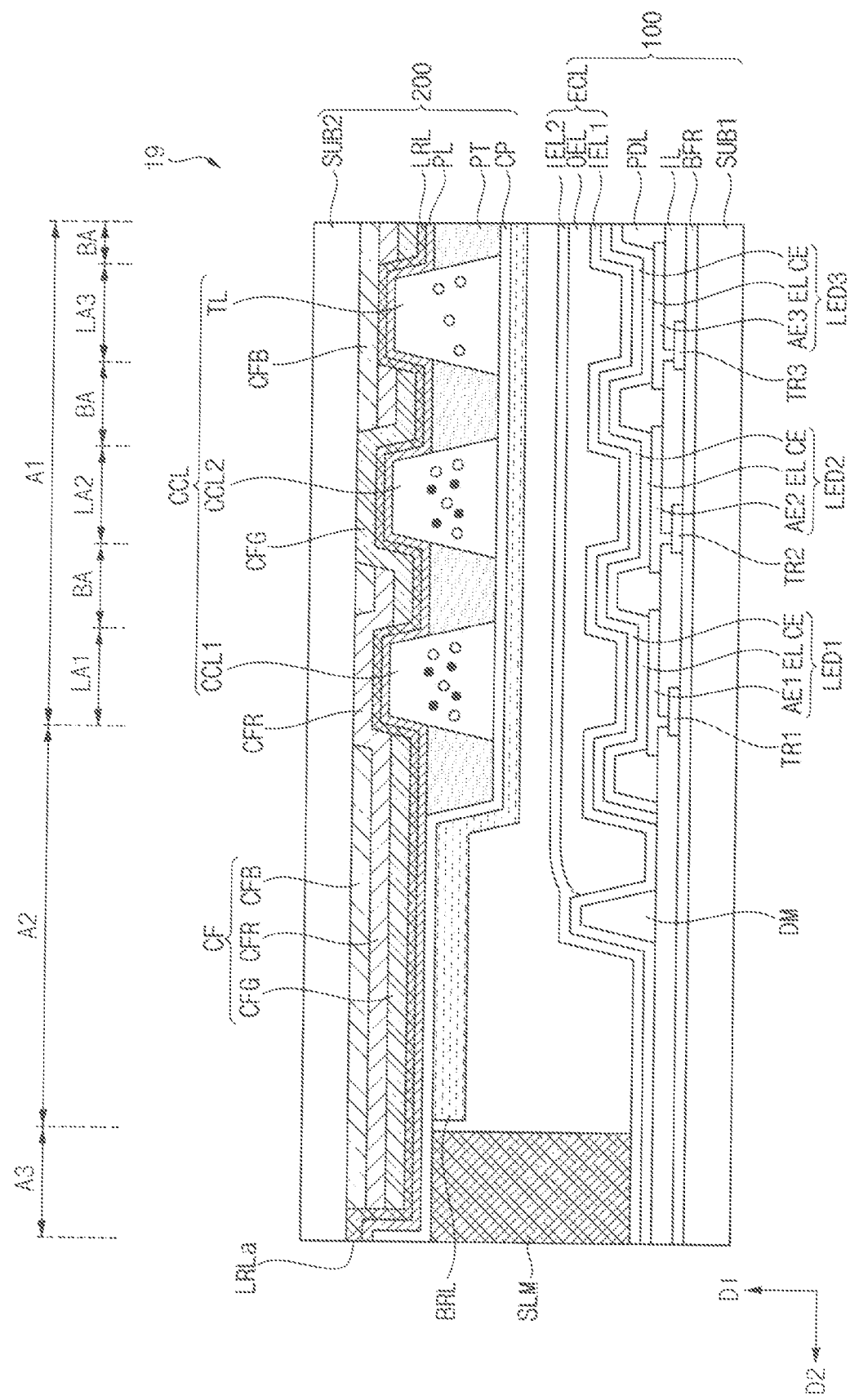
FIG. 24 is a cross-sectional view illustrating a display device according to an embodiment.

FIG. 24 is a cross-sectional view illustrating a display device according to an embodiment.

For example, in the display device 19 described in more detail below with reference to FIG. 24, redundant description of the same or substantially the same configuration as those of the display device 12 described above with reference to FIG. 7 and the display device 13 described above with reference to FIG. 12 may not be repeated.

Referring to FIG. 24, a display device 19 may include a lower substrate 100, an upper substrate 200, and a sealing member SLM. The lower substrate 100 may include a first substrate SUB1, a buffer layer BFR, first to third driving elements TR1, TR2, TR3, an insulation layer IL, a pixel defining layer PDL, first to third light emitting elements LED1, LED2, and LED3, and an encapsulation layer ECL. The upper substrate 200 may include a second substrate SUB2, a color filter layer CF, a partition structure PT, a color conversion layer CCL, a low refractive index layer LRL, a protective layer PL, and a capping layer CP.

The display device 19 may include a first area A1, a second area A2, and a third area A3, and thus, each of the first substrate SUB1 and the second substrate SUB2 may also include the first area A1, the second area A2, and the third area A3.

In an embodiment, the low refractive index layer LRL may be disposed under (e.g., underneath) the color filter layer CF. Unlike the display device 13 of FIG. 12, the side surface LRLa of the low refractive index layer LRL may be exposed to the outside.

In an embodiment, the low refractive index layer LRL may overlap with the sealing member SLM. The low refractive index layer LRL may cover the color filter layer CF, and may be exposed to the outside at (e.g., in or on) the third area A3. The protective layer PL may cover the lower surface of the low refractive index layer LRL. The protective layer PL may expose the side surface LRLa of the low refractive index layer LRL. However, the present disclosure is not limited thereto.

In an embodiment, the barrier layer BRL may be disposed under (e.g., underneath) the protective layer PL and the capping layer CP. The barrier layer BRL may overlap with the second area A2. The barrier layer BRL may overlap with the color conversion layer CCL at (e.g., in or on) the first area A1. At least a portion of the barrier layer BRL may overlap with the color conversion layer CCL, and may be disposed under (e.g., underneath) the color conversion layer CCL. The barrier layer BRL may not be disposed at (e.g., in or on) the third area A3, and may be spaced apart from the sealing member SLM in a plan view.

In an embodiment, when the low refractive index layer LRL is exposed to the outside of the display device 19, external moisture may enter through the low refractive index layer LRL. Because the barrier layer BRL is a moisture barrier layer, the barrier layer BRL may prevent or substantially prevent the moisture from moving in the direction of the lower substrate 100. Accordingly, reliability of the display device 19 may be improved by preventing or substantially preventing a defect in the display device 19.

However, the present disclosure is not limited thereto, and the barrier layer BRL may not be disposed at (e.g., in or on) the first area A1, and may not overlap with the color conversion layer CCL (e.g., see FIG. 7).

Figure 25:
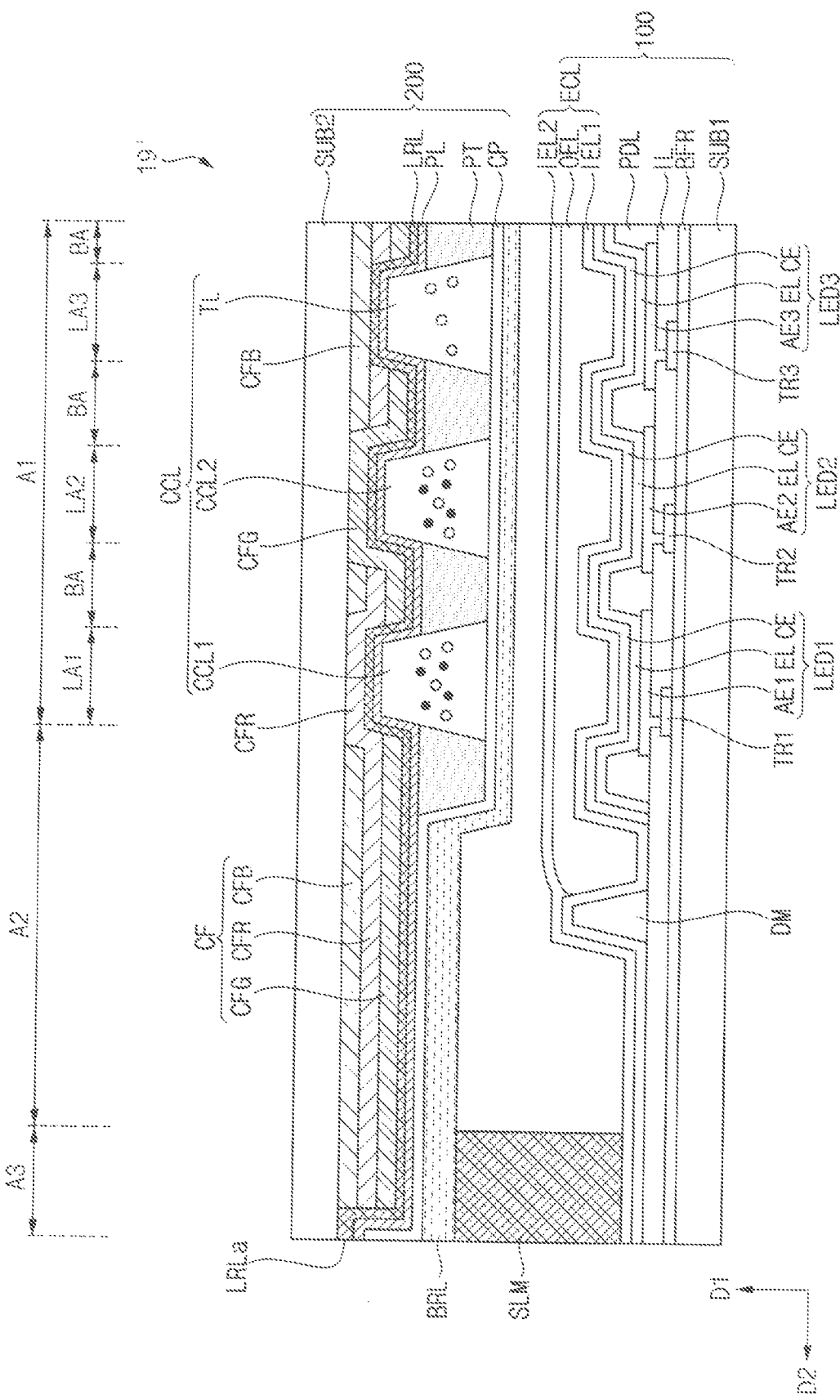
FIG. 25 is a cross-sectional view illustrating another example of the display device of FIG. 24.

FIG. 25 is a cross-sectional view illustrating another example of the display device of FIG. 24.

Referring to FIG. 25, the barrier layer BRL included in the display device 19' may overlap with the first area A1, the second area A2, and the third area A3. Unlike the display device 19 of FIG. 24, the barrier layer BRL may be disposed at (e.g., in or on) the third area A3, and may overlap with the sealing member SLM. In other words, the barrier layer BRL may be disposed between the sealing member SLM and the capping layer CP at (e.g., in or on) the third area A3.

However, the present disclosure is not limited thereto, and the barrier layer BRL may not be disposed at (e.g., in or on) the first area A1, and may not overlap with the color conversion layer CCL (e.g., see FIG. 11).

According to one or more embodiments of the present disclosure, the display device may be applied to a computer, a notebook, a mobile phone, a smartphone, a smart pad, a PMP, a PDA, an MP3 player, and/or the like.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
   a first substrate including a first area, a second area surrounding the first area, and a third area surrounding the second area;
   a second substrate facing the first substrate in a thickness direction;
   a sealing member between the first substrate and the second substrate at the third area;
   a color filter layer under the second substrate;
   a first layer under the color filter layer and with a different refractive index than adjacent layers;
   a second layer under the first layer and overlapping with the sealing member;
   a third layer under the second layer and above the first substrate; and
   a capping layer between the second layer and the third layer and extending in the thickness direction to cover a side surface of the first layer.

2. The display device of claim 1, wherein the color filter layer overlaps with the sealing member.

3. The display device of claim 1, wherein the color filter layer comprises a first color filter, a second color filter, and a third color filter.

4. The display device of claim 3, wherein a portion of the first color filter, a portion of the second color filter, and a portion of the third color filter overlap each other in a plan view.

5. The display device of claim 3, wherein the first area includes a light emitting area and a light blocking area surrounding the light emitting area, and
   a portion of the first color filter, a portion of the second color filter, and a portion of the third color filter overlap each other at the light blocking area.

6. The display device of claim 3, wherein a portion of the first color filter, a portion of the second color filter, and a portion of the third color filter overlap each other at the second area.

7. The display device of claim 3, wherein each of the first color filter, the second color filter, and the third color filter overlaps with the sealing member.

8. The display device of claim 1, wherein a side surface of the capping layer is exposed to outside.

9. The display device of claim 1, wherein the capping layer overlaps with the sealing member.

10. A display device comprising:
    a first substrate including a first area, a second area surrounding the first area, and a third area surrounding the second area;
    a second substrate facing the first substrate;
    a sealing member between the first substrate and the second substrate at the third area;
    a color filter layer under the second substrate;
    a first layer under the color filter layer and with a different refractive index than adjacent layers;
    a second layer under the first layer and overlapping with the sealing member;
    a third layer under the second layer; and
    a color conversion layer between the second layer and the capping layer in the first area and comprising a plurality of color conversion parts spaced from each other.

11. The display device of claim 1, wherein a side surface of the first layer is exposed to outside.

12. The display device of claim 1, wherein a side surface of the second layer is exposed to outside.

13. The display device of claim 1, wherein a side surface of the third layer is exposed to outside.

14. The display device of claim 1, wherein the first layer overlaps with the sealing member.

15. The display device of claim 1, wherein the third layer overlaps with the sealing member.

16. A display device comprising:
    a first substrate including a first area, a second area surrounding the first area, and a third area surrounding the second area;
    a second substrate facing the first substrate;
    a sealing member between the first substrate and the second substrate at the third area;
    a color filter layer under the second substrate;
    a first layer under the color filter layer and with a different refractive index than adjacent layers;
    a second layer under the first layer and overlapping with the sealing member; and
    a third layer under the second layer,
    wherein the second layer is a protective layer comprising an inorganic material, and
    the third layer is a barrier layer comprising at least one organic layer.

* * * * *